(12) United States Patent
Yokokawa

(10) Patent No.: US 6,944,727 B2
(45) Date of Patent: Sep. 13, 2005

(54) INTERLEAVING APPARATUS AND INTERLEAVING METHOD, ENCODING APPARATUS AND ENCODING METHOD, AND DECODING APPARATUS AND DECODING METHOD

(75) Inventor: Takashi Yokokawa, Tokyo (JP)

(73) Assignee: Sony Corporation, Tokyo (JP)

( * ) Notice: Subject to any disclaimer, the term of this patent is extended or adjusted under 35 U.S.C. 154(b) by 261 days.

(21) Appl. No.: 10/328,952

(22) Filed: Dec. 23, 2002

(65) Prior Publication Data

US 2003/0154343 A1 Aug. 14, 2003

(30) Foreign Application Priority Data

Dec. 25, 2001 (JP) .......................................... 2001-391494

(51) Int. Cl.[7] .............................................. G06F 12/06
(52) U.S. Cl. ........................................................ 711/157
(58) Field of Search ................................. 711/157, 217, 711/220; 714/702

(56) References Cited

U.S. PATENT DOCUMENTS 6,442,728 B1 * 8/2002 Cui et al. .................... 714/786
6,598,202 B1 * 7/2003 Kim et al. ................... 714/786
6,603,412 B2 * 8/2003 Gatherer et al. .............. 341/61
6,701,467 B1 * 3/2004 Victor ......................... 714/701
6,732,316 B1 * 5/2004 Tong et al. ................... 714/756
6,772,391 B1 * 8/2004 Shin ............................ 714/786

OTHER PUBLICATIONS

Japanese Publication–Foundations in Turbo Coding: Triceps KK, White Series No. 198, Oct. 7, 1999; (English Translation) p 37, 38, 61, 62.

* cited by examiner

*Primary Examiner*—Kevin L. Ellis
(74) *Attorney, Agent, or Firm*—Frommer Lawrence & Haug LLP; William S. Frommer

(57) ABSTRACT

An interleaver which is applied to an encoding apparatus and/or a decoding apparatus in a data transmission/reception system comprises two banks of single-port RAM, and a control unit for controlling writing and reading of data to and from the two banks of RAM. The interleaver controls writing and reading of data to and from the two banks of RAM with the control unit such that the input data, wherein permuting from the input data into the output data is symmetrical, and which is at an arbitrary position wherein, with regard to an integer i which is 2 or greater and integers j and k which are 0 or greater but less than i, the residue from division by i is j, is output as the output data at a position wherein the residue from division by i is k. Accordingly, consecutive interleaving processing can be realized with a small circuit size.

48 Claims, 27 Drawing Sheets

FIG. 6A

| DD0 | DD1 | DD2 | DD3 | DD4 | DD5 | DD6 | DD7 | DD8 | DD9 |

FIG. 6B

| DD2 | DD9 | DD0 | DD5 | DD4 | DD3 | DD8 | DD7 | DD6 | DD1 |

INTERLEAVING APPARATUS AND INTERLEAVING METHOD, ENCODING APPARATUS AND ENCODING METHOD, AND DECODING APPARATUS AND DECODING METHOD

BACKGROUND OF THE INVENTION

1. Field of the Invention

The present invention relates to an interleaving device and an interleaving method, for permuting the order of input data following predetermined addresses and outputting as output data, an encoding apparatus and an encoding method, for encoding by concatenating multiple component codes in parallel or serially via interleaving processing, and a decoding apparatus and a decoding method, for decoding generated codes by concatenating multiple component codes in parallel or serially via interleaving processing.

2. Description of the Related Art

In recent years, while study with regard to the communication field such as mobile communication or deep-space communication, and the broadcasting field such as ground wave or satellite digital broadcasting, for example, has been remarkably advanced, study has also been widely undertaken with regard to code theorem for error correction encoding and efficiency improvement of encoding.

The Shannon limit obtained by the so-called Shannon's (C. E. Shannon) communication path encoding theorem is known as the theoretical limit of code performance.

Study with regard to code theorem has been made in order to develop codes exhibiting performance approaching the Shannon limit. In recent years, the Parallel Concatenated Convolutional Codes (which will be referred to as "PCCC" hereafter) or the Serially Concatenated Convolutional Codes (which will be referred to as "SCCC" hereafter), which are referred to as so-called turbo-codes, for example, have been developed as encoding methods exhibiting the performance approaching the Shannon limit.

On the other hand, in recent years, study on decoding methods corresponding to these codes, has also been widely undertaken. Specifically, studies with regard to methods for reducing the symbol error rate by employing soft-output as decoding output of inner codes in concatenated codes or output of each repeated decoding operation in the repeated decoding method has been made, and study with regard to the decoding methods suitable thereto has been widely undertaken. For example, the BCJR algorithm which is described in "Bahl, Cocke, Jelinek and Raviv, 'Optimal Decoding of linear codes for minimizing symbol error rate', IEEE Trans. Inf. Theory, vol. IT-20, pp. 284–287, March, 1974" is known as a method for minimizing the symbol error rate in the event of decoding predetermined codes such as convolutional codes or the like. With the BCJR algorithm, each symbol is not output, rather, the likelihood of each symbol is output as decoding results. The above-described output is referred to as soft-output.

Details of the BCJR algorithm will be described below. Let us now consider a case wherein digital information is subjected to convolutional encoding by an encoding apparatus 201 included in a transmission device which is not shown in drawings, and the output is observed by inputting the output to a receiving device, which is not shown in drawings, via a non-storage channel 202 containing noise, and decoding the output by a decoding apparatus 203 included in the receiving device, as shown in FIG. 20.

First of all, an M number of states (transition states) indicating the state of the shift resistors included in the encoding apparatus 201 are represented by m (0, 1, . . . , M−1), and the state at the time t is represented by St. Also, making an assumption that k bits of information is input in one time slot, the input at the time t is represented by it=(it1, it2, . . . , itk), and the input system is represented by I1T=(i1, i2, . . . , iT). At this time, in the event that transition from the state m' to the state m occurs, the information bits corresponding to the transition are represented by i(m', m)=(i1(m', m), i2(m', m), . . . , ik(m', m)). Moreover, making an assumption that n bits of code are output in one time slot, the output at the time t is represented by xt=(xt1, xt2, . . . , xtn), and the output system is represented by X1T=(x1, x2, . . . , xT). At this time, in the event that the transition from the state m' to the state m occurs, the code bit corresponding to the transition is represented by x(m', m)=(x1(m', m), x2(m', m), . . . , xn(m', m)).

The convolutional encoding by the encoding apparatus 201 begins at the state S0=0, and ends at the state ST=0 following output of X1T. Here, the transition probability Pt(m|m') between states is defined by the following Expression (1).

Expression (1)

$$P_t(m|m')=Pr\{S_t=m|S_{t-1}=m'\} \quad (1)$$

Note that the Pr{A|B} shown in the right side in the above Expression (1) represents the conditional probability that A is generated under the conditions that B is generated. The transition probability Pt(m|m') equals the probability Pr{it=i} wherein, in the event of transition from the state m' to the state m under the input i, the input it at the time t is i, as shown in the following Expression (2).

Expression (2)

$$P_t(m|m')=Pr\{i_t=i\} \quad (2)$$

X1T is input to the non-storage channel 202 containing noise, and Y1T is output therefrom. Here, making an assumption that n bits of reception values are output in one time slot, the output at the time t is represented by yt=(yt1, yt2, . . . , ytn), and is represented by Y1T=(y1, y2, . . . , yT). The transition probability of the non-storage channel 202 containing noise can be defined as shown in the following Expression (3) with regard to all the t (1≦t≦T) using the transition probability Pr {yj|xj} for each symbol.

Expression (3)

$$Pr\{Y_1^t | X_1^t\} = \prod_{j=1}^{t} Pr\{y_j | x_j\} \quad (3)$$

Here, let us define λtj as shown in the following Expression (4). This λtj shown in the following Expression (4) represents the likelihood of the input information at the time t at the point that Y1T is received, and is the soft-output which is to be obtained.

Expression (4)

$$\lambda_{tj} = \frac{Pr\{i_{tj} = 1 | Y_1^T\}}{Pr\{i_{tj} = 0 | Y_1^T\}} \quad (4)$$

In the BCJR algorithm, the probabilities αt, βt, and γt, as shown in the following Expression (5) through (7) are defined. Here, Pr{A;B} represents the probability wherein both A and B are generated.

Expression (5)

$$\alpha_t(m) = Pr\{S_t = m; Y_1^t\} \quad (5)$$

Expression (6)

$$\beta_t(m) = Pr\{Y_{t+1}^T | S_t = m\} \quad (6)$$

Expression (7)

$$\gamma_t(m', m) = Pr\{S_t = m; y_t | S_{t-1} = m'\} \quad (7)$$

Here, details of the probabilities αt, βt, and γt, will be described using a trellis, which is a state transition diagram in the encoding apparatus 201, shown in FIG. 21. In the drawing, αt−1 corresponds to the passage probability of each state at the time t−1, which is calculated based upon reception values beginning at the encoding beginning state S0=0 in time-sequence. Also, βt corresponds to the passage probability of each state at the time t, which is calculated based upon reception values beginning at the encoding end state ST=0 in inverse time-sequence.

Moreover, γt corresponds to the receiving probability of the output at each branch wherein the transition between states occurs at the time t, which is calculated based upon the reception value at the time t and the input probability.

Using the probabilities αt, βt, and γt, the soft-output λtj can be represented as shown in the following Expression (8).

Expression (8)

$$\lambda_{tj} = \frac{\sum_{\substack{m',m \\ i_j(m',m)=1}} \alpha_t(m')\gamma_t(m', m)\beta_t(m)}{\sum_{\substack{m',m \\ i_j(m',m)=0}} \alpha_t(m')\gamma_t(m', m)\beta_t(m)} \quad (8)$$

Now, the following Expression (9) holds with regard to t=1, 2, . . . , T.

Expression (9)

$$\alpha_t(m) = \sum_{m'=0}^{M-1} \alpha_{t-1}(m')\gamma_t(m', m) \quad \text{ただし}. \quad \alpha_0(0) = 1, \alpha_0(m) = 0 (m \neq 0) \quad (9)$$

In the same way, the following Expression (10) holds with regard to t=1, 2, . . . , T.

Expression (10)

$$\beta_t(m) = \sum_{m'=0}^{M-1} \beta_{t+1}(m')\gamma_{t+1}(m, m') \quad \text{ただし}. \quad \beta_T(0) = 1, \beta_T(m) = 0 (m \neq 0) \quad (10)$$

Moreover, the following Expression (11) holds with regard to λt.

Expression (11)

$$\gamma_t(m', m) = \begin{cases} P_t(m|m') \cdot Pr\{y_t | x(m', m)\} \\ = Pr\{i_t = i(m', m)\} \cdot Pr\{y_t | x(m', m)\} \\ \quad \text{: case wherein transition is made} \\ \quad \text{from } m' \text{ to } m \text{ with input } i \\ 0 \\ \quad \text{: case wherein transition is not made} \\ \quad \text{from } m' \text{ to } m \text{ with input } i \end{cases} \quad (11)$$

Accordingly, in the event of performing soft-output decoding by applying the BCJR algorithm, the decoding apparatus 203 obtains the soft-output λtj by performing a series of processes shown in FIG. 22 based upon these relationships.

First of all, as shown in the drawing, in Step S201, the decoding apparatus 203 calculates the probabilities αt(m) and λt(m', m) using the above Expression (9) and the above Expression (11) every time yt is received.

Next, in Step S202, the decoding apparatus 203 calculates the probability βt(m) with regard to each state m in all times t using the above Expression (10) following receiving of the entire system Y1T.

In Step S203, the decoding apparatus 203 then substitutes the probabilities αt, βt, and γt, which are calculated in Step S201 and Step S202, into the above Expression (8) so as to calculate the soft-output λt at each time t.

The decoding apparatus 203 can perform soft-output decoding wherein the BCJR algorithm is applied, by performing a series of processes described above.

Now, with the BCJR algorithm, computation has to be performed with the probabilities being held as the values which are to be handled, and there are difficulties wherein the amount of computations is great due to multiplication being included. As techniques for reducing the amount of computations, the Max-Log-MAP algorithm and Log-MAP algorithm (which will be referred to as the "Max-Log-BCJR algorithm" and "Log-BCJR algorithm" hereafter) have been described in "Robertson, Villebrun and Hoeher, 'A comparison of optimal and sub-optimal MAP decoding algorithms operating in the domain', IEEE Int. Conf. on Communications, pp. 1009–1013, June 1995".

First of all, the Max-Log-BCJR algorithm will be described. The Max-Log-BCJR algorithm is a function consisting of writing the probabilities αt, βt, and γt, and the soft-output λt, as a logarithm using the natural logarithm, rewriting the multiplication with regard to the probabilities as the addition in the logarithm as shown in the following Expression (12), and also approximating the addition regarding the probabilities with the maximum value computation in the logarithm as shown in the following Expression (13). Note that max(x, y) represents the function wherein the greater value of x or y is selected.

Expression (12)

$$\log(e^x \cdot e^y) = x+y \quad (12)$$

Expression (13)

$$\log(e^x + e^y) \approx \max(x,y) \quad (13)$$

Here, to simplify description, the natural logarithm will be abbreviated as I, and the natural logarithmic values of αt, βt, γt, and λt, will be represented by Iαt, Iβt, Iγt, and Iλt, respectively, as shown in the following Expression (14). Note that sgn shown in the following Expression (14) is the constant indicating a sign for specifying positive or negative, i.e., either of "+1" or "-1".

Expression (14)

$$\begin{cases} I\alpha_t(m) = sgn \cdot \log(\alpha_t(m)) \\ I\beta_t(m) = sgn \cdot \log(\beta_t(m)) \\ I\gamma_t(m) = sgn \cdot \log(\gamma_t(m)) \\ I\lambda_t = sgn \cdot \log \lambda_t \end{cases} \quad (14)$$

The main reason that the constant sgn is given as described above, is that the calculated logarithmic likelihood (log likelihood) $I\alpha t$, $I\beta t$, and $I\gamma t$, generally have negative values due to the probabilities $\alpha t$, $\beta t$, and $\gamma t$, having values between 0 and 1.

For example, while in the event that the decoding apparatus 203 is configured as software, both positive values and negative values can be processed, and accordingly the constant sgn may be "+1" or "-1", in the event that the decoding apparatus 203 is configured as hardware, it is desirable that the calculated positive/negative specification symbol of the negative value is reversed so as to handle as a positive value in order to reduce the number of bits.

That is to say, in the event that the decoding apparatus 203 is configured as a system which handles only the negative values as log likelihood, the constant sgn is "+1", in the event that the decoding apparatus 203 is configured as a system which handles only the positive values as log likelihood, the constant sgn is "-1". Description will be made with regard to the algorithm wherein the constant sgn described above is taken into consideration.

In the Max-Log-BCJR algorithm, the log likelihoods $I\alpha t$, $I\beta t$, and $I\gamma t$, are approximated as shown in the following Expression (15) through the following Expression (17), respectively. Here, in the event that the constant sgn is "+1", msgn(x, y) shown in the following Expression (15) and the following Expression (16) represents the function max(x, y) wherein the greater value of x or y is selected, and in the event that the constant sgn is "-1", represents the function min(x, y) wherein the smaller value of x or y is selected. The function msgn in the state m' in the right side in the following Expression (15) is obtained in the state m' in which the transition to the state m occurs, and the function msgn in the state m' in the right side in following Expression (16) is obtained in the state m' in which the transition from the state m occurs.

Expression (15)

$$I\alpha_t(m) \approx \underset{m'}{msgn}(I\alpha_{t-1}(m') + I\gamma_t(m', m)) \quad (15)$$

Expression (16)

$$I\beta_t(m) \approx \underset{m'}{msgn}(I\beta_{t+1}(m') + I\gamma_{t+1}(m, m')) \quad (16)$$

Expression (17)

$$I\gamma_t(m', m) = sgn \cdot (\log(Pr\{i_t = i(m', m)\}) + \log(Pr\{y_t \mid x(m', m)\})) \quad (17)$$

In the same way, in the Max-Log-BCJR algorithm, the logarithmic soft-output $I\lambda t$ is also approximated as shown in the following Expression (18). Here, in the event that the input is "1", the function msgn in the first argument in the right side in the following Expression (18) is obtained in the state m' in which the transition to the state m occurs, and in the event that the input is "0", the function msgn in the second argument is obtained in the state m' in which the transition to the state m occurs.

Expression (18)

$$I\lambda_{tj} \approx \underset{\substack{m',m \\ i,j(m',m)=1}}{msgn} (I\alpha_{t-1}(m') + I\gamma_t(m', m) + I\beta_t(m)) - \underset{\substack{m',m \\ i,j(m',m)=0}}{msgn} (I\alpha_{t-1}(m') + I\gamma_t(m', m) + I\beta_t(m)) \quad (18)$$

Accordingly, in the event that soft-output decoding is performed by applying the Max-Log-BCJR algorithm, the decoding apparatus 203 obtains the soft-output $\lambda t$ by following a series of processes shown in FIG. 23 based upon these relationships described above.

First of all, in Step S211, the decoding apparatus 203 calculates the logarithmic likelihoods $I\alpha t(m)$, $I\beta t(m)$, and $I\gamma t(m', m)$, using the above Expression (15) and the above Expression (17) each time yt is received, as shown in the drawing.

Next, In Step S212, the decoding apparatus 203 calculates the logarithmic likelihood $I\beta t(m)$ for each state m at all the times t, using the above Expression (16) following receiving of the entire system YIT.

In Step S213, the decoding apparatus 203 then calculates the logarithmic soft-output $I\lambda t$ at each time t by substituting the logarithmic likelihoods $I\alpha t$, $I\beta t$, and $I\gamma t$, which have been calculated in Step S211 and Step S212, into the above Expression (18).

The decoding apparatus 203 can perform soft-output encoding to which the Max-log-BCJR algorithm is applied, by following such a series of processes.

As described above, the Max-log-BCJR algorithm does not include multiplication, and accordingly the amount of computations can be reduced as compared with the BCJR algorithm.

The Log-BCJR algorithm will now be described. The Log-BCJR algorithm has been developed so as to further improve precision of approximation of the Max-Log-BCJR algorithm. Specifically, the Log-BCJR algorithm is modified from the Max-Log-BCRJ algorithm, by adding the compensation argument to the addition regarding the probabilities shown in the above Expression (13), as shown in the following Expression (19), so as to obtain a precise logarithmic value of addition. Here, the above-described compensation will be referred to as the log-sum compensation.

Expression (19)

$$\log(e^x + e^y) = \max(x, y) + \log(1 + e^{-|x-y|}) \quad (19)$$

Here, the computation shown in the left side in the above Expression (19) will be referred to as the log-sum computation, and the operator of the log-sum computation will be represented as "#" (which is represented as "E" in the following description), for convenience, following the rules described in "S. S. Pietrobon, 'Implementation and performance of a turbo/MAP decoder', Int. J. Satellite Commun., vol. 16, pp. 23–46, January-February 1998."

Expression (20)

$$x\#y = \log(e^x + e^y) \quad (20)$$

Note that the above-described constant sgn is assumed to be "+1" in the above Expression (19) and the above Expression (20). In the event that the constant sgn is "-1", the following Expression (21) and the following Expression (22) holds, corresponding to the above Expression (19) and the above Expression (20), respectively.

Expression (21)

$$-\log(e^{-x}+e^{-y}) = \min(x,y) - \log(1+e^{-|x-y|}) \quad (21)$$

Expression (22)

$$x \# y = -\log(e^{-x}+e^{-y}) \quad (22)$$

Moreover, the operator of accumulated addition of the log-sum computation will be represented as "#Σ" (which is represented as "E" in the description) as shown in the following Expression (23).

Expression (23)

$$\# \sum_{i=0}^{M-1} x_i = ((\cdots((x_0 \# x_1) \# x_2) \cdots) \# x_{M-1}) \quad (23)$$

Using these operators, the logarithmic likelihoods $I\alpha t$ and $I\beta t$ and the logarithm soft-output $I\lambda$ can be represented as shown in the following Expressions (24) through (26), respectively. Note that the logarithmic likelihood $I\gamma t$ is represented as in the above Expression (17), so description thereof will be omitted. Expression (24)

$$I\alpha_t(m) = \# \sum_{m'=0}^{M-1} (I\alpha_{t-1}(m') + I\gamma_t(m', m)) \quad (24)$$

Expression (25)

$$I\beta_t(m) = \# \sum_{m'=0}^{M-1} (I\beta_{t+1}(m') + I\gamma_{t+1}(m, m')) \quad (25)$$

Expression (26)

$$I\lambda_{tj} = \underset{\substack{m',m \\ i_j(m',m)=1}}{\# \Sigma} (I\alpha_{t-1}(m') + I\gamma_t(m', m) + I\beta_t(m)) - \underset{\substack{m',m \\ i_j(m',m)=0}}{\# \Sigma} (I\alpha_{t-1}(m') + I\gamma_t(m', m) + I\beta_t(m)) \quad (26)$$

Note that the accumulated addition of the log-sum computation in the state m' in the right side in the above Expression (24) is obtained in the state m' in which the transition to the state m occurs, and the accumulated addition of the log-sum computation in the state m' in the right side in the above Expression (25) is obtained in the state m' in which the transition from the state m occurs. Also, in the above Expression (26), in the event that the input is "1", the accumulated addition of the log-sum computation of the first argument in the right side is obtained in the state m' in which the transition to the state m occurs, and in the event that the input is "0", the accumulated addition of the log-sum computation of the second argument is obtained in the state m' in which the transition to the state m occurs.

Accordingly, in the event that soft-output decoding is performed by applying the Log-BCRJ algorithm, the decoding apparatus 203 can obtain the soft-output λt by following a series of processes as shown in the above-described FIG. 23, based upon these relationships.

First of all, in Step S211, the decoding apparatus 203 calculates the logarithmic likelihoods Iαt(m) and Iλt(m', m), each time yt is received, using the above Expression (24) and the above Expression (17), as shown in the drawing.

Next, in Step S212, the decoding apparatus 203 calculates Iβt(m) for each state m at all the times t, following receiving of the entire system Y1T, using the above Expression (25).

In Step S213, the decoding apparatus 203 then calculates the logarithmic soft-output Iλt at each time t by substituting the logarithmic likelihoods Iαt, Iβt, and Iγt, which have been calculated in Step S211 and Step S212, into the above Expression (26).

The decoding apparatus 203 can perform soft-output decoding, which the Log-BCJR algorithm is applied, by following a series of processes described above. Note that in the above Expression (19) and the above Expression (21), the compensation argument shown in the second argument in the right side is represented by a one-dimensional function with regard to the variable |x−y|, and accordingly the decoding apparatus 203 can perform precise probability calculation by storing these values as a table in the ROM (Read Only Memory) or the like, which is not shown in the drawings.

While the amount of computations in the Log-BCJR algorithm increases as compared with that in the Max-Log-BCJR algorithm, multiplication is not included, and the output is the logarithmic value of the soft-output except for quantization margin of error.

While the BCJR algorithm, the Max-Log-BCJR algorithm, or the Log-BCJR algorithm, are algorithms which enable decoding of trellis codes such as convolutional codes or the like, the algorithm can be applied to decoding of codes generated by concatenating multiple component encoders wherein the component codes are the trellis codes, via interleavers. That is to say, the BCJR algorithm, the Max-Log-BCJR algorithm, or the Log-BCJR algorithm, can be applied to decoding of the PCCC or SCCC, described above, or turbo trellis encoded modulation (which will be referred to as "TTCM" hereafter) or serial concatenated trellis encoded modulation (which will be referred to as SCTCM hereafter), wherein the above-described PCCC or SCCC is applied to multi-value modulation so as to integrate and take into consideration the decoding performance of the positioning of the signal point and error correction codes.

The decoding apparatus for decoding the PCCC, SCCC, TTCM, or SCTCM, concatenates multiple decoders for performing Maximum A Posteriori probability (MAP) decoding based upon the BCJR algorithm, the Max-Log-BCJR algorithm, or the Log-BCJR algorithm, via interleavers, so as to perform so-called repeated decoding.

Here, a storage device such as RAM (Random Access Memory) or the like is used as an interleaver, and performs interleaving by writing data in a certain order and reading the data in a different order from the writing order. In this case, there is the need to use a storage device with capacity for storage of data twice the interleaving length as an interleaver.

Specifically, an example wherein data of which one frame corresponds to the interleaving length for ten time slots is interleaved using two banks of RAM of which number of words corresponds to ten time slots is shown in FIGS. 24 through 29. Here, for convenience, one of the two banks, shown at the upper side in the drawings, is referred to as a bank A, and the other, shown at the lower side in the drawings, is referred to as a bank B. Also, addresses 0, 1, 2, . . . , 9, are assigned to each bank of RAM, from the left side in the drawing, respectively. Moreover, writing of data is denoted by W and reading of data is denoted by R in the drawings.

First of all, the interleaver writes the first frame of data in the bank A RAM.

That is to say, as shown in FIG. 24, the interleaver writes the data DD0 in the storage area at the address 0 in the bank A RAM in the 0th time slot. Next, the interleaver writes the data DD1 in the storage area at the address 1 in the bank A RAM in the 1st time slot, writes the data DD2 in the storage area at the address 2 in the bank A RAM in the 2nd time slot, and writes the data DD3 in the storage area at the address 3 in the bank A RAM in the 3rd time slot. In the same way, the interleaver writes the data in the storage area at each address in the bank A RAM in each time slot, and writes the data DD9 in the storage area at the address 9 in the bank A RAM in the ninth time slot.

As described above, the interleaver writes the first frame of data in the bank A RAM in the order of DD0, DD1, DD2, DD3, DD4, DD5, DD6, DD7, DD8, and DD9.

Next, the interleaver reads out the first frame of data, which has been written in the bank A RAM, in a different order from the writing order, and also writes the second frame of data in the bank B RAM.

That is to say, as shown in FIG. 25, in the 10th time slot, the interleaver reads out the data DD2 from the storage area at the address 2 in the bank A RAM, i.e., the storage area in which the data DD2 has been written in the second time slot, and also writes the data DD10 in the storage area at the address 0 in the bank B RAM. Next, in the 11th time slot, the interleaver reads out the data DD9 from the storage area at the address 9 in the bank A RAM, i.e., the storage area in which the data DD9 has been written in the 9th time slot, and also writes the data DD11 in the storage area at the address 1 in the bank B RAM. Next, in the 12th time slot, the interleaver reads out the data DD0 from the storage area at the address 0 in the bank A RAM, i.e., the storage area in which the data DD0 has been written in the 0th time slot, and also writes the data DD12 in the storage area at the address 2 in the bank B RAM. Next, in the 13th time slot, the interleaver reads out the data DD5 from the storage area at the address 5 in the bank A RAM, i.e., the storage area in which the data DD5 has been written in the 5th time slot, and also writes the data DD13 in the storage area at the address 3 in the bank B RAM. Next, in the 14th time slot, the interleaver reads out the data DD4 from the storage area at the address 4 in the bank A RAM, i.e., the storage area in which the data DD4 has been written in the 4th time slot, and also writes the data DD14 in the storage area at the address 4 in the bank B RAM.

Moreover, as shown in FIG. 26, in the 15th time slot, the interleaver reads out the data DD3 from the storage area at the address 3 in the bank A RAM, i.e., the storage area in which the data DD3 has been written in the 3rd time slot, and also writes the data DD15 in the storage area at the address 5 in the bank B RAM. Next, in the 16th time slot, the interleaver reads out the data DD8 from the storage area at the address 8 in the bank A RAM, i.e., the storage area in which the data DD8 has been written in the 8th time slot, and also writes the data DD16 in the storage area at the address 6 in the bank B RAM. Next, in the 17th time slot, the interleaver reads out the data DD7 from the storage area at the address 7 in the bank A RAM, i.e., the storage area in which the data DD7 has been written in the 7th time slot, and also writes the data DD17 in the storage area at the address 7 in the bank B RAM. Next, in the 18th time slot, the interleaver reads out the data DD6 from the storage area at the address 6 in the bank A RAM, i.e., the storage area in which the data DD6 has been written in the 6th time slot, and also writes the data DD18 in the storage area at the address 8 in the bank B RAM. In the 19th time slot, the interleaver then reads out the data DD1 from the storage area at the address 1 in the bank A RAM, i.e., the storage area in which the data DD1 has been written in the 1st time slot, and also writes the data DD19 in the storage area at the address 9 in the bank B RAM.

As described above, the interleaver reads out all of the first frame of the data which has been written in the bank A RAM in the order of DD0, DD1, DD2, DD3, DD4, DD5, DD6, DD7, DD8, and DD9, in a different order from the writing order, i.e., in the order of DD2, DD9, DD0, DD5, DD4, DD3, DD8, DD7, DD6, and DD1, and also writes the second frame of data in the bank B RAM in the order of DD10, DD11, DD12, DD13, DD14, DD15, DD16, DD17, DD18, and DD19.

Next, the interleaver reads out the second frame of data which has been written in the bank B RAM in a different order from the writing order, and also writes the third frame of data in the bank A RAM.

That is to say, as shown in FIG. 27, in the 20th time slot, the interleaver reads out the data DD12 from the storage area at the address 2 in the bank B RAM, i.e., the storage area in which the data DD12 has been written in the 12th time slot, and also writes the data DD20 in the storage area at the address 0 in the bank A RAM, i.e., the storage area from which the data DD0 has been read out in the 12th time slot and now is empty. Next, in the 21st time slot, the interleaver reads out the data DD19 from the storage area at the address 9 in the bank B RAM, i.e., the storage area in which the data DD19 has been written in the 19th time slot, and also writes the data DD21 in the storage area at the address 1 in the bank A RAM, i.e., the storage area from which the data DD1 has been read out in the 19th time slot and now is empty. Next, in the 22nd time slot, the interleaver reads out the data DD10 from the storage area at the address 0 in the bank B RAM, i.e., the storage area in which the data DD10 has been written in the 10th time slot, and also writes the data DD22 in the storage area at the address 2 in the bank A RAM, i.e., the storage area from which the data DD2 has been read out in the 10th time slot and now is empty. Next, in the 23rd time slot, the interleaver reads out the data DD15 from the storage area at the address 5 in the bank B RAM, i.e., the storage area in which the data DD15 has been written in the 15th time slot, and also writes the data DD23 in the storage area at the address 3 in the bank A RAM, i.e., the storage area from which the data DD3 has been read out in the 15th time slot and now is empty. Next, in the 24th time slot, the interleaver reads out the data DD14 from the storage area at the address 4 in the bank B RAM, i.e., the storage area in which the data DD14 has been written in the 14th time slot, and also writes the data DD24 in the storage area at the address 4 in the bank A RAM, i.e., the storage area from which the data DD4 has been read out in the 14th time slot and now is empty.

Moreover, as shown in FIG. 28, in the 25th time slot, the interleaver reads out the data DD13 from the storage area at the address 3 in the bank B RAM, i.e., the storage area in which the data DD13 has been written in the 13th time slot, and also writes the data DD25 in the storage area at the address 5 in the bank A RAM, i.e., the storage area from which the data DD5 has been read out in the 13th time slot and now is empty. Next, in the 26th time slot, the interleaver reads out the data DD18 from the storage area at the address 8 in the bank B RAM, i.e., the-storage area in which the data DD18 has been written in the 18th time slot, and also writes the data DD26 in the storage area at the address 6 in the bank A RAM, i.e., the storage area from which the data DD6 has been read out in the 18th time slot and now is empty. Next, in the 27th time slot, the interleaver reads out the data DD17 from the storage area at the address 7 in the bank B RAM, i.e., the storage area in which the data DD17 has been written in the 17th time slot, and also writes the data DD27 in the storage area at the address 7 in the bank A RAM, i.e., the storage area from which the data DD7 has been read out in the 17th time slot and now is empty. Next, in the 28th time slot, the interleaver reads out the data DD16 from the storage area at the address 6 in the bank B RAM, i.e., the storage area in which the data DD16 has been written in the 16th time slot, and also writes the data DD28 in the storage area at the address 8 in the bank A RAM, i.e., the storage area from which the data DD8 has been read out in the 16th time slot and now is empty. In the 29th time slot, the interleaver reads out the data DD11 from the storage area at the address 1 in the bank B RAM, i.e., the storage area in which the data DD11 has been written in the 11th time slot, and also writes the data DD29 in the storage area at the address 9 in the bank A RAM, i.e., the storage area from which the data DD9 has been read out in the 11th time slot and now is empty.

As described above, the interleaver reads out all the second frame of the data which has been written in the order of DD10, DD11, DD12, DD13, DD14, DD15, DD16, DD17, DD18, and DD19, in the bank B RAM, in a different order from the writing order, i.e., in the order of DD12, DD19, DD10, DD15, DD14, DD13, DD18, DD17, DD16, and DD11, and also writes the third frame of data in the bank A RAM in the order of DD20, DD21, DD22, DD23, DD24, DD25, DD26, DD27, DD28, and DD29.

In the same way, the interleaver reads out the third frame of data which has been written in the bank A RAM in a different order from the writing order, and also writes the fourth frame of data in the bank B RAM.

That is to say, as shown in FIG. 29, in the 30th time slot, the interleaver reads out the data DD22 from the storage area at the address 2 in the bank A RAM, i.e., the storage area in which the data DD22 has been written in the 22nd time slot, and also writes the data DD30 in the storage area at the address 0 in the bank B RAM, i.e., the storage area from which the data DD10 has been read out in the 22nd time slot and now is empty. Next, in the 31st time slot, the interleaver reads out the data DD29 from the storage area at the address 9 in the bank A RAM, i.e., the storage area in which the data DD29 has been written in the 29th time slot, and also writes the data DD31 in the storage area at the address 1 in the bank B RAM, i.e., the storage area from which the data DD11 has been read out in the 29th time slot and now is empty. Next, in the 32nd time slot, the interleaver reads out the data DD20 from the storage area at the address 0 in the bank A RAM, i.e., the storage area in which the data DD20 has been written in the 20th time slot, and also writes the data DD32 in the storage area at the address 2 in the bank B RAM, i.e., the storage area from which the data DD12 has been read out in the 20th time slot and now is empty. In the 33rd time slot, the interleaver then reads out the data DD25 from the storage area at the address 5 in the bank A RAM, i.e., the storage area in which the data DD25 has been written in the 25th time slot, and also writes the data DD33 in the storage area at the address 3 in the bank B RAM, i.e., the storage area from which the data DD13 has been read out in the 25th time slot and now is empty.

As described above, the interleaver reads out all the third frame of the data which has been written in the bank A RAM in the order of DD20, DD21, DD22, DD23, DD24, DD25, DD26, DD27, DD28, and DD29, in a different order from the writing order, i.e., DD22, DD29, DD20, DD25, . . . , and also writes the fourth frame of the data in the bank B RAM in the order of DD30, DD31, DD32, DD33, . . . .

As described above, the interleaver can perform interleaving wherein writing of data and reading of data can be continuously performed by using two banks of RAM having the same capacity as the interleaving length, i.e., RAM having capacity twice the interleaving length, and switching between the operations wherein data is written in one of the banks in an order and data is read out from the other bank in a different order from the writing order, between the two banks. At this time, as described above, an arrangement may be made wherein the interleaver writes data in the RAM in a sequential manner, as well as reading data which has been written in the RAM following a reading order which is generated by a predetermined circuit, or is read out from a predetermined storage medium in which an interleaving pattern has been stored as the reading order. Conversely, an arrangement may also be made wherein the interleaver writes data in the RAM following a writing order which is generated by a predetermined circuit, or is read out from a predetermined storage medium in which an interleaving pattern has been stored as the writing order, as well as reading data written in the RAM in a sequential manner.

Now, it is known that in a case of applying an interleaver to a decoding apparatus for decoding PCCC, SCCC, TTCM, or SCTCM, the longer the length of the interleaving length is, the more the code performance is improved.

However, a storage device having the capacity twice the interleaver length for storing of data has been used for an interleaver for the reason that operations are necessitated wherein the data which is to be interleaved is temporarily written in a storage device of the interleaving length and also the data which has been written in the storage device is read out, due to the writing order for the data being different from the reading order for the data, as described above. Accordingly, in a case of applying the above-described interleaver to the decoding apparatus, in the event that the interleaving length of the interleaver is increased, the size of the storage device in the decoding apparatus increases, causing the problem in that the circuit size of the decoding apparatus also increases.

Also, the interleaver is an indispensable component in encoding apparatuses for performing encoding by PCCC, SCCC, TTCM, or SCTCM, and accordingly, in a case of applying the interleaver to the encoding apparatus, in the event that the interleaving length increases, the size of the storage device in the encoding apparatus increases, causing the problem in that the circuit scale of the decoding apparatus increases.

SUMMARY OF THE INVENTION

The present invention has been made in light of the above problems, and accordingly, it is an object thereof to provide: an interleaving apparatus and interleaving enabling reduction of the size of the circuits while providing excellent usability; an encoding apparatus and encoding method capable of performing encoding with PCCC, SCCC, TTCM, or SCTCM, while maintaining the performance of the code by applying the interleaving apparatus and interleaving method; and a decoding apparatus and decoding method capable of performing repeated decoding by applying the interleaving apparatus and interleaving method.

The interleaving apparatus according to the present invention for solving the above-described problems is an interleaving apparatus which permutes the order of input data that is input following predetermined addresses, and outputs the permuted data as output data, the apparatus comprising:

storage means for storing data; and control means for controlling writing and reading of data to and from the storage means such that the input data, wherein permuting from the input data into the output data is symmetrical, and which is at an arbitrary position wherein, with regard to an integer i which is 2 or greater and integers j and k which are 0 or greater but less than i, the residue from division by i is j, is output as the output data at a position wherein the residue from division by i is k.

The interleaving apparatus according to the present invention thus configured controls writing and reading of data to and from the storage means by control means such that the input data, wherein permuting from the input data into the output data is symmetrical, and which is at an arbitrary position wherein, with regard to an integer i which is 2 or greater and integers j and k which are 0 or greater but less than i, the residue from division by i is j, is output as the output data at a position wherein the residue from division by i is k. Accordingly, consecutive interleaving processing can be realized with a small circuit size.

Also, the interleaving method according to the present invention for solving the above-described problems is an interleaving method for permuting the order of input data that is input following predetermined addresses, and outputting the permuted data as output data, the method comprising: an inputting step for inputting data; and a control step for controlling writing and reading of data to and from the storage means such that the input data, wherein permuting from the input data into the output data is symmetrical, and which is at an arbitrary position wherein, with regard to an integer i which is 2 or greater and integers j and k which are 0 or greater but less than i, the residue from division by i is j, is output as the output data at a position wherein the residue from division by i is k.

The interleaving method according to the present invention thus arranged controls writing and reading of data to and from the storage means such that the input data, wherein permuting from the input data into the output data is symmetrical, and which is at an arbitrary position wherein, with regard to an integer i which is 2 or greater and integers j and k which are 0 or greater but less than i, the residue from division by i is j, is output as the output data at a position wherein the residue from division by i is k. Accordingly, consecutive interleaving processing can be realized with a small circuit size.

Further, the encoding apparatus according to the present invention for solving the above-described problems is an encoding apparatus for concatenating a plurality of component codes in parallel or serially via interleaving processing to perform encoding, the encoding apparatus comprising: a plurality of component encoding means for performing predetermined encoding on input data; and interleaving means disposed between each of the plurality of component encoding means concatenated in parallel or serially, for permuting the order of input data following predetermined addresses, and outputting the permuted data as output data, wherein the interleaving means comprise: storage means for storing data; and control means for controlling writing and reading of data to and from the storage means such that the input data, wherein permuting from the input data into the output data is symmetrical and which is at an arbitrary position wherein, with regard to an integer i which is 2 or greater and integers j and k which are 0 or greater but less than i, the residue from division by i is j, is output as the output data at a position wherein the residue from division by i is k.

The encoding apparatus according to the present invention thus configured uses the interleaving means provided between each of the component encoding means to perform interleaving processing in which control is effected to write and read data to and from the storage means such that the input data, wherein permuting from the input data into the output data is symmetrical, and which is at an arbitrary position wherein, with regard to an integer i which is 2 or greater and integers j and k which are 0 or greater but less than i, the residue from division by i is j, is output as the output data at a position wherein the residue from division by i is k. Accordingly, consecutive interleaving processing can be realized with a small circuit size, while maintaining code performance.

Further yet, the encoding method according to the present invention for solving the above-described problems is an encoding method for concatenating a plurality of component codes in parallel or serially via interleaving processing to perform encoding, the encoding method comprising: a plurality of component encoding steps for performing predetermined encoding on input data; and an interleaving step which is executed between each of the plurality of component encoding steps concatenated in parallel or serially, for permuting the order of input data that is input following predetermined addresses, and outputting the permuted data as output data, wherein the interleaving step comprises: an inputting step for inputting the input data; a control step for controlling writing and reading of data to and from the storage means for storing data such that the input data, wherein permuting from the input data into the output data is symmetrical and which is at an arbitrary position wherein, with regard to an integer i which is 2 or greater and integers j and k which are 0 or greater but less than i, the residue from division by i is j, is output as the output data at a position wherein the residue from division by i is k; and an outputting step for outputting the output data.

The encoding method according to the present invention thus arranged performs interleaving processing, in the interleaving steps provided between each of the component encoding steps, in which control is effected to write and read data to and from the storage means such that the input data, wherein permuting from the input data into the output data is symmetrical, and which is at an arbitrary position wherein, with regard to an integer i which is 2 or greater and integers j and k which are 0 or greater but less than i, the residue from division by i is j, is output as the output data at a position wherein the residue from division by i is k. Accordingly, consecutive interleaving processing can be realized with a small circuit size, while maintaining code performance.

Also, the decoding apparatus according to the present invention for solving the above-described problems is a decoding apparatus for decoding code generated by concatenating a plurality of component codes in parallel or serially via interleaving processing, the decoding apparatus comprising: a plurality of soft-output decoding means provided corresponding to the plurality of component codes, for performing soft-output decoding by inputting received values to be taken as soft-input and a priori probability information, thereby generating soft-output and/or extrinsic information at each time; and interleaving means wherein the extrinsic information generated by the soft-output decoding means is input, for performing interleaving processing for permuting the order of the extrinsic information according to predetermined addresses, based on the same permuting position information as the interleaving processing in encoding, or de-interleaving processing for permuting the order of the extrinsic information according to predetermined addresses, so as to restore the array of information permuted by the interleaving processing in encoding, wherein the interleaving means comprise: storage means for storing data; and control means for controlling writing and reading of data to and from the storage means such that the input data, wherein permuting from input data that is input into output data that is output is symmetrical and which is at an arbitrary position wherein, with regard to an integer i which is 2 or greater and integers j and k which are 0 or greater but less than i, the residue from division by i is j, is output as the output data at a position wherein the residue from division by i is k.

The decoding apparatus according to the present invention thus configured uses the interleaving means to perform interleaving processing or de-interleaving processing in which control is effected to write and read data to and from the storage means such that the input data, wherein permuting from the input data into the output data is symmetrical, and which is at an arbitrary position wherein, with regard to an integer i which is 2 or greater and integers j and k which are 0 or greater but less than i, the residue from division by i is j, is output as the output data at a position wherein the residue from division by i is k. Accordingly, consecutive interleaving processing or de-interleaving processing can be realized with a small circuit size, while maintaining code performance.

Moreover, the decoding method according to the present invention for solving the above-described problems is a decoding method for decoding code generated by concatenating a plurality of component codes in parallel or serially via interleaving processing, the decoding method comprising: a plurality of soft-output decoding steps provided corresponding to the plurality of component codes, for performing soft-output decoding by inputting received values to be taken as soft-input and a priori probability information, thereby generating soft-output and/or extrinsic information at each time; and an interleaving step wherein the extrinsic information generated in the soft-output decoding steps is input, for performing interleaving processing for permuting the order of the extrinsic information according to predetermined addresses, based on the same permuting position information as the interleaving processing in encoding, or de-interleaving processing for permuting the order of the extrinsic information according to predetermined addresses, so as to restore the array of information permuted by the interleaving processing in encoding, wherein the interleaving step comprises: an inputting step for inputting data; a control step for controlling writing and reading of data to and from the storage means such that the input data, wherein permuting from input data that is input in the inputting step into output data that is output is symmetrical and which is at an arbitrary position wherein, with regard to an integer i which is 2 or greater and integers j and k which are 0 or greater but less than i, the residue from division by i is j, is output as the output data at a position wherein the residue from division by i is k; and an outputting step for outputting the output data.

The decoding method according to the present invention thus arranged performs interleaving processing or de-interleaving processing in the interleaving step, in which control is effected to write and read data to and from the storage means such that the input data, wherein permuting from the input data into the output data is symmetrical, and which is at an arbitrary position wherein, with regard to an integer i which is 2 or greater and integers j and k which are 0 or greater but less than i, the residue from division by i is j, is output as the output data at a position wherein the residue from division by i is k. Accordingly, consecutive interleaving processing or de-interleaving processing can be realized with a small circuit size, while maintaining code performance.

BRIEF DESCRIPTION OF THE DRAWINGS

FIGS. 6A and 6B are diagrams describing the actions of the interleaver provided to the encoding apparatus and/or the decoding apparatus for writing and reading data, with FIG. 6A illustrating the manner in which input data is sequentially written to each storage device, and FIG. 6B illustrating the manner in which the data written to each storage device being read out as output data;

DESCRIPTION OF THE PREFERRED EMBODIMENTS

An actual embodiment to which the present invention is applied will be described in detail below, with reference to the drawings.

Figure 1:
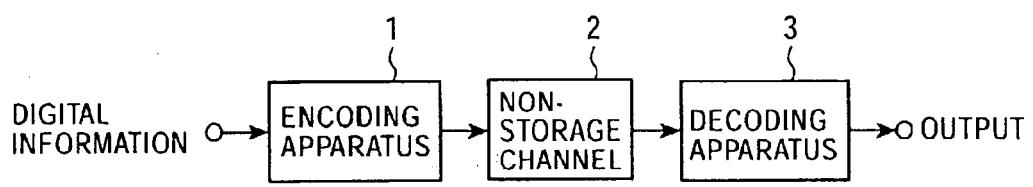
FIG. 1 is a block diagram describing the configuration of a communication model to which a data transmission/reception system given as an embodiment of the present invention is applied.

The embodiment is a data transmission/reception system to which a communication model is applied, wherein digital information is encoded by an encoding apparatus 1 included in a transmission device which is not shown in drawings, the output is input to a reception device which is not shown in drawings via a non-storage channel 2 containing noise, and is decoded by a decoding apparatus 3 included in the reception device, as shown in FIG. 1.

With the data transmission/reception system, the encoding apparatus 1 is configured so as to carry out Parallel Concatenated Convolutional Codes (which will be referred to as "PCCC" hereafter) or Serially Concatenated Convolutional Codes (which will be referred to as "SCCC" hereafter), wherein trellis codes such as convolutional codes or the like are assumed to be component codes, or Turbo Trellis Encoded Modulation (which will be referred to as "TTCM" hereafter) or Serial Concatenated Trellis Encoded Modulation (which will be referred to as "SCTCM" hereafter), wherein PCCC or SCCC described above is applied to multi-value modulation. The above encoding is known as a kind of so-called Turbo encoding, and the encoding apparatus 1 is configured so as to perform Turbo encoding by concatenating multiple component encoder and interleavers for permutation of input data.

On the other hand, the decoding apparatus 3 performs decoding of codes which have been encoded by the encoding apparatus 1, and is configured so as to perform repeated decoding by concatenating interleavers for permutation of the input data and multiple soft-output decode circuits for performing Maximum A Posteriori probability decoding (which will be referred to as MAP) based upon the BCJR algorithm described in "Bahl, Cocke, Jelinek and Raviv, 'Optimal decoding of linear codes for minimizing symbol error rate', IEEE Trans. Inf. Theory, vol. IT-20, pp. 284–287, March 1974", or the Max-Log-MAP algorithm or the Log-MAP algorithm (which will be referred to as the Max-Log-BCJR algorithm or the Log-BCJR algorithm hereafter) described in "Robertson, Villebrun and Hoeher, 'A comparison of optimal and sub-optimal MAP decoding algorithms operating in the domain', IEEE Int. Conf. on Communications, pp. 1009–1013, June 1995", and obtaining the soft-output and/or so-called extrinsic information corresponding to so-called a posteriori probability information.

Particularly, with the encoding apparatus 1 and/or decoding apparatus 3, the interleaver performs permuting wherein permuting from the input data into the output data is symmetrical, and the input data which is of an even number in order is output at an even number in order, and also the input data which is of an odd number in order is output at an odd number, following addresses, and continuous interleaving can be performed using only a storage device of which capacity is the same as the interleaving length, by performing reading in a manner alternating each frame between sequential reading and non-sequential reading according to addresses.

Figure 2:
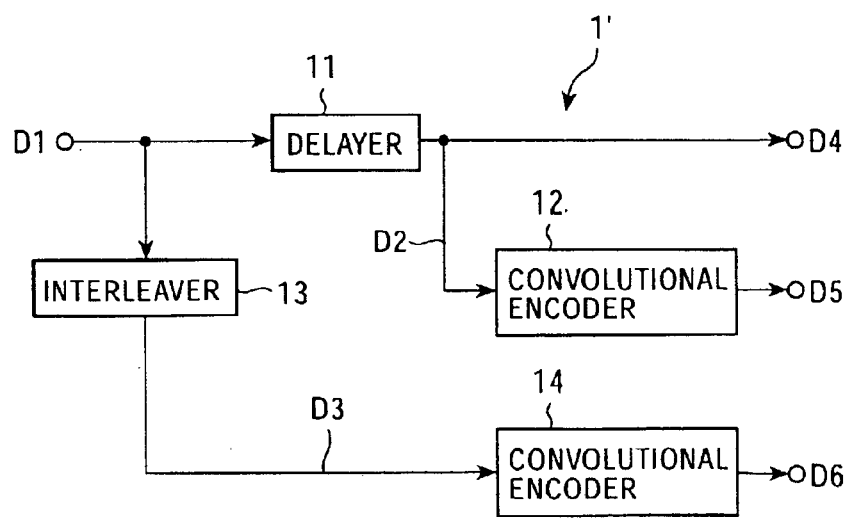
FIG. 2 is a block diagram describing the configuration of an example of an encoding apparatus in the above data transmission/reception system, describing the configuration of an encoding apparatus which performs encoding by PCCC.

First of all, to make the outline of the present invention clearer, an encoding apparatus 1' and a decoding apparatus 3' for performing encoding and decoding by PCCC shown in FIGS. 2 and 3, and an encoding apparatus 1" and a decoding apparatus 3" for performing encoding and decoding by SCCC shown in FIGS. 4 and 5, will be described, prior to detailed description of the present invention. These encoding apparatuses 1' and 1" are examples of the encoding apparatus 1, and these decoding apparatuses 3' and 3" are examples of the decoding apparatus 3.

First of all, the encoding apparatus 1' for performing encoding by PCCC and the decoding apparatus 3' for decoding the codes by the encoding apparatus 1', will be described.

Let us say that the encoding apparatus 1' includes a delayer 11 for delaying the input data, two convolutional encoding apparatuses 12 and 14 for performing convolutional computation, and an interleaver 13 for permutation of the order of the input data. The encoding apparatus 1' performs parallel concatenated convolutional computation of which encoding rate is ⅓ for the one bit of the input data D1, so as to generate three bits of the output data D4, D5, and D6, and output externally via a modulator using modulation such as Binary Phase Shift Keying (which will be referred to as "BPSK" hereafter) or Quadrature Phase Shift Keying (which will be referred to as "QPSK" hereafter), for example.

The delayer 11 is included for matching the timing wherein the 3-bit output data D4, D5, and D6, are output, and in the event that the 1-bit input data D1 is input, the delayer 11 delays the input data D1 by the time period which is the same as the processing period for the operation of the interleaver 13. The delayer 11 outputs the delay data D2, which has been delayed, externally as the output data D4, and also supplies to the following convolutional encoding apparatus 12.

In the event of inputting the 1-bit delay data D2 which has been output from the delayer 11, the convolutional encoding apparatus 12 performs convolutional computation for the delay data D2, and outputs the computation results externally as the output data D5.

In the event that input data D1 made up of a 1-bit system is input to the interleaver 13, the interleaver 13 permutes the order of each bit making up the input data D1, and supplies the generated interleaved data D3 to a following convolutional encoding apparatus 14.

In the event of inputting the 1-bit interleaved data D3 supplied from the interleaver 13, the convolutional encoding apparatus 14 performs convolutional computation for the interleaved data D3, and outputs the computation results externally as the output data D6.

In the event of inputting the 1-bit input data D1, the above-described encoding apparatus 1' performs parallel concatenated convolutional computation of which encoding rate is ⅓ as a whole, by the operations wherein the input data D1 is output as it is as the output data D4 via the delayer 11, and outputting the output data D5 which is obtained from the results of convolutional computation regarding the delayed data D2 by the convolutional encoding apparatus 12, and the output data D6 which is obtained from the results of convolutional computation regarding the interleaved data D3 by the convolutional encoding apparatus 14. Signal point mapping is performed for the data encoded by the encoding apparatus 1' by a modulator, which is not shown in the drawings, based upon a predetermined modulation system, and output to the receiving device via non-storage channel 2.

Figure 3:
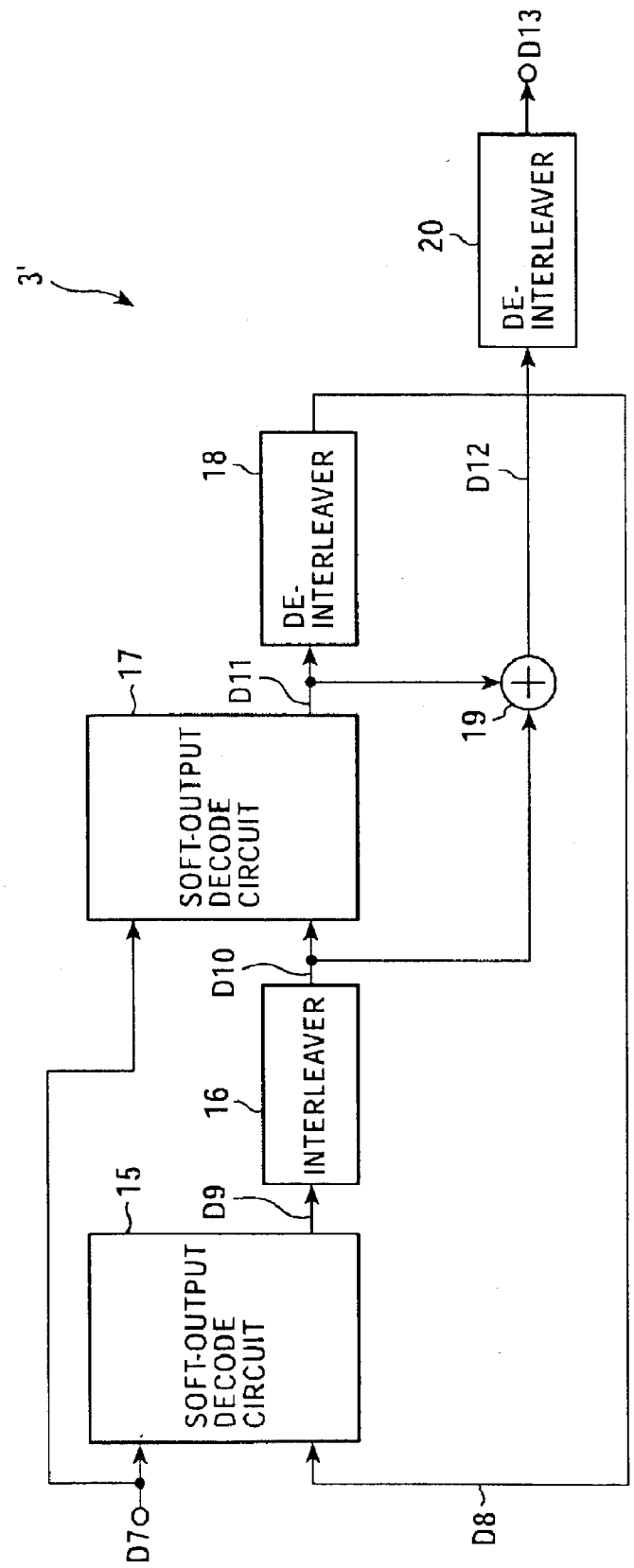
FIG. 3 is a block diagram describing the configuration of an example of a decoding apparatus in the above data transmission/reception system, describing the configuration of a decoding apparatus which performs decoding of the encoding performed by the encoding apparatus shown in FIG. 2.

On the other hand, as shown in FIG. 3, let us say that the decoding apparatus 3' for decoding of codes from the encoding apparatus 1' includes two decoding circuits 15 and 17 for performing soft-output decoding, an interleaver 16 for permutation of the order of the input data, two de-interleavers 18 and 20 for restoring the order of the input data, and an addition unit 19 for adding two pieces of data. The decoding apparatus 3' estimates the input data D1 at the encoding apparatus 1' from the received value D7 which is assumed to be soft-output due to noise generated in the non-storage channel 2, and output as decoded data D13.

The soft-output decode circuit 15 is included corresponding to the convolutional encoding apparatus 12 in the encoding apparatus 1', and performs MAP decoding based upon the BCJR algorithm, Max-Log-BCJR algorithm, or Log-BCJR algorithm, described above. That is to say, in the event of inputting a priori probability information D8 regarding the information bits of the soft-input output from the de-interleaver 18, as well as the soft-input received value D7, the soft-output decode circuit 15 performs soft-output decoding using the received value D7 and a priori probability information D8. The soft-output decode circuit 15 then generates extrinsic information D9 with regard to the information bits obtained by constriction conditions of the code, and outputs the extrinsic information D9 as soft-output to the following interleaver 16.

The interleaver 16 performs interleaving for the extrinsic information D9 with regard to the information bits, which is soft-input, output from the soft-output decode circuit 15, based upon the same permutation position information as the interleaver 13 in the encoding apparatus 1'. The interleaver 16 output the data obtained by interleaving, as a priori probability information D1 regarding the information bits in the following soft-output decode circuit 17, and also outputs to the following addition unit 19.

A soft-output decode circuit 17 is provided corresponding to the convolutional encoder 14 in the encoding apparatus 1', and performs MAP decoding based on the BCJR algorithm, Max-Log-BCJR algorithm, or Log-BCJR algorithm, as with the soft-output decode circuit 15. That is to say, the soft-output decode circuit 17 inputs the reception value D7 of the soft-input, while also inputting the a priori probability information D10 corresponding to the information bits of the soft-input output from the interleaver 16, and performs soft-output decoding using the reception value D7 and the a priori probability information D10. The soft-output decode circuit 17 then generates the intrinsic information D11 relating to information bits obtained by the constriction conditions of the code and outputs the intrinsic information D11 to the de-interleaver 18 as soft-output, as well as outputting to the addition unit 19.

A de-interleaver 18 subjects the intrinsic information D11 of the soft-input output from the soft-output decode circuit 17 to de-interleaving processing, so that the bit array of the interleaved data D3 interleaved by the interleaver 13 in the encode device 1' is restored to the bit array of the original input data D1. The de-interleaver 18 outputs the data obtained by de-interleaving, as a priori probability information D8 corresponding to the information bits in the soft-output decode circuit 15.

An addition unit 19 adds the a priori probability information D10 corresponding to the information bits output from the interleaver 16 and the intrinsic information D11 corresponding to the information bits output from the soft-output decode circuit 17.

A de-interleaver 20 subjects the data D12 of the soft-output output from the addition unit 19 to de-interleaving processing, so that the bit array of the interleaved data D3 interleaved by the interleaver 13 in the encoding apparatus 1' is restored to the bit array of the original input data D1. The de-interleaver 20 outputs the data obtained by de-interleaving, as decoded data D13.

Such a decoding apparatus 3' comprises soft-output decode circuits 15 and 17 corresponding to each of the convolutional encoders 12 and 14 in the encoding apparatus 1', and thus can break down code with a high degree of decoding complexity into components with small complexity, thereby successively improving properties by the interaction between the soft-output decode circuits 15 and 17.

Note that an encoding apparatus which performs encoding by TTCM can be realized by comprising a modulator which performs modulation by 8-Phase Shit Keying (hereafter referred to as "8PSK"), for example, at the final level of the encoding apparatus 1'. Also, a decoding apparatus which performs decoding by TTCM can be realized by the same configuration as the decoding apparatus 3', to which same-phase component and orthogonal component symbols are directly input as reception values.

Next, an encoding apparatus 1" which performs encoding by SCCC, and a decoding apparatus 3" which performs decoding of the code encoded by the encoding apparatus 1", will be described.

Figure 4:
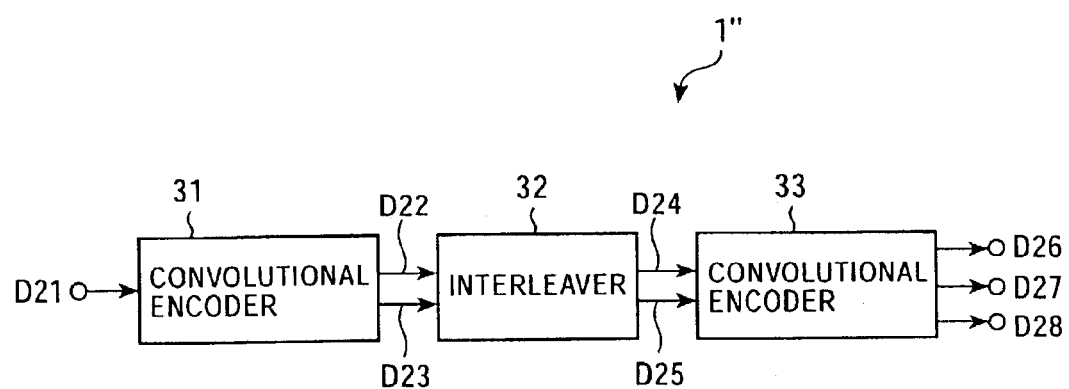
FIG. 4 is a block diagram describing the configuration of an example of an encoding apparatus in the above data transmission/reception system, describing the configuration of an encoding apparatus which performs encoding by SCCC.

As shown in FIG. 4, an example of the encoding apparatus 1" comprises a convolutional encoder 31 which performs encoding of code called outer code, an interleaver 32 which permutes the order of input data, and a convolutional decoder 33 which performs encoding of code called inner code. The encoding apparatus 1" performs serial concatenated convolutional computation with an encoding percentage of ⅓ on 1 bit of input data D21 that is input, so as to generate 3 bits of output data D26, D27, and D28, which are externally output via an unshown modulator which performs modulation by, for example, BPSK modulation or QPSK modulation.

Upon inputting 1 bit of input data D21, the convolutional encoder 31 performs convolutional computation on the input data D21, and supplies the computation results to the following interleaver 32 as 2-bit encoded data D22 and D23. That is to say, the convolutional encoder 31 performs convolutional computation with an encoding percentage of ½ as encoding for outer code, and supplies the generated encoded data D22 and D23 to the following interleaver 32.

The interleaver 32 inputs the encoded data D22 and D23 made up of a two-bit system supplied from the convolutional encoder 31, permutes the order of each of the bits configuring the encoded data D22 and D23, and supplies the interleaved data D24 and D25 made up of the generated two-bit system to the following convolutional encoder 33.

Upon receiving input of the 2-bit interleaved data D24 and D25 supplied from the interleaver 32, the convolutional encoder 33 subjects the interleaved data D24 and D25 to convolutional computation, and externally outputs the computation results as 3-bit output data D26, D27, and D28. That is to say, the convolutional encoder 33 performs convolutional computation with an encoding percentage of ⅔ as encoding for inner code, and externally outputs the output data D26, D27, and D28.

The encoding apparatus 1" thus configured performs convolutional computation with an encoding percentage of ½ as encoding for outer code with the convolutional encoder 31, and performs convolutional computation with an encoding percentage of ⅔ as encoding for inner code with the convolutional encoder 33, and thus overall performs serial concatenated convolutional computation with an encoding percentage of (½)×(⅔)=⅓. The data encoded by the encoding apparatus 1" is subjected to signal point mapping based on a predetermined modulation method by an unshown modulator, and is output to a receiving device via the non-storage channel 2.

Figure 5:
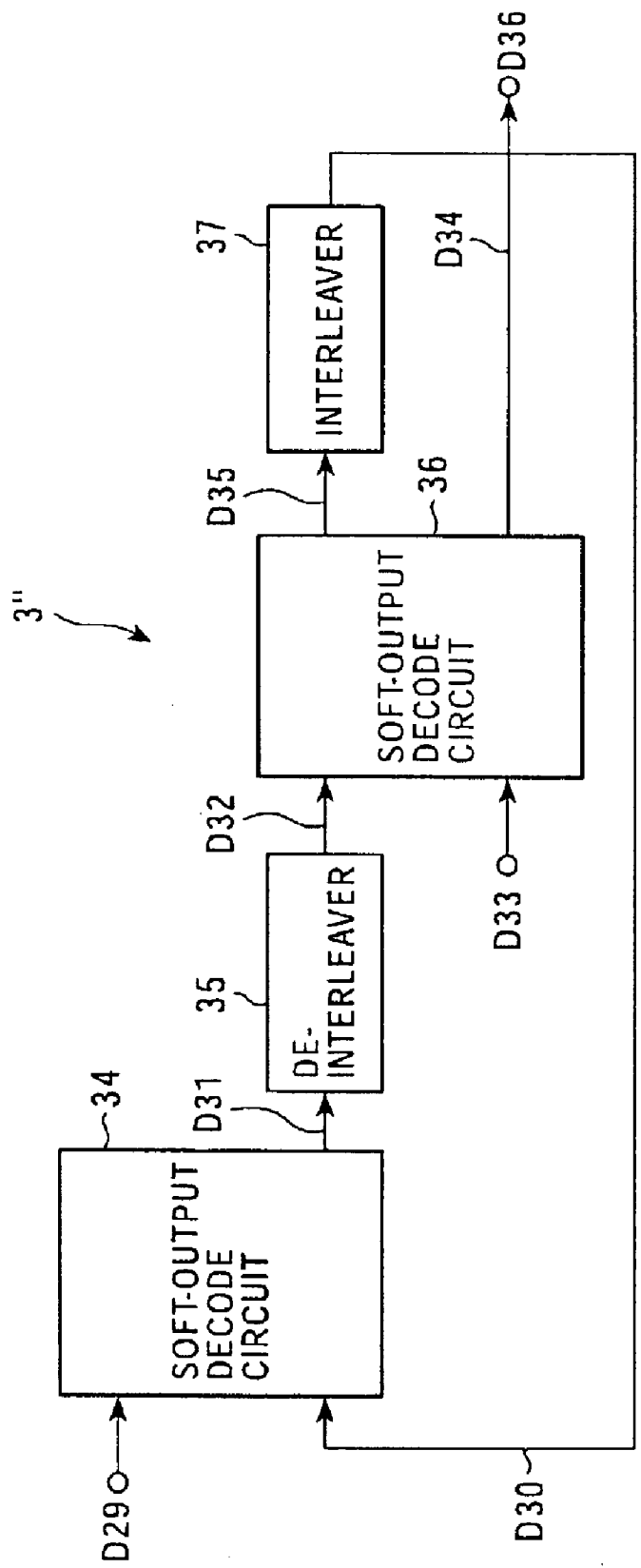
FIG. 5 is a block diagram describing the configuration of an example of a decoding apparatus in the above data transmission/reception system, describing the configuration of a decoding apparatus which performs decoding of the encoding performed by the encoding apparatus shown in FIG. 4.

On the other hand, as shown in FIG. 5, an example of the decoding apparatus 3" which performs decoding of code encoded by the encoding apparatus 1" comprises two soft-output decode circuits 34 and 36 which perform soft-output decoding, a de-interleaver 35 which restores the order of input data, and an interleaver 37 which permutes the order of input data. This decoding apparatus 3" estimates input data D21 in the encoding apparatus 1" from the reception value D29 which is taken as soft-input due to the effects of nose occurring on the non-storage channel 2, which is output as decoded data D36.

The soft-output decode circuit 34 is provided corresponding to the convolutional encoder 33 in the encoding apparatus 1", and performs MAP decoding based on the BCJR algorithm, Max-Log-BCJR algorithm, or Log-BCJR algorithm. That is to say, the soft-output decode circuit 34 inputs the reception value D29 of soft-input, while also inputting a priori probability information D30 relating to the information bit of the soft-input output from the interleaver 37, and performs soft-output decoding of the inner code by MAP decoding based on the BCJR algorithm, Max-Log-BCJR algorithm, or Log-BCJR algorithm, using the reception value D29 and the a priori probability information D30. The soft-output decode circuit 34 then generates extrinsic information D31 corresponding to the information bit obtained by constriction conditions of the code, and outputs this extrinsic information D31 to the following de-interleaver 35.

Note that this extrinsic information D31 corresponds to the interleaved data D24 and 25 interleaved by the interleaver 32 in the encoding apparatus 1".

The de-interleaver 35 subjects the extrinsic information D31 of the soft-input output from the soft-output decode circuit 34 to de-interleaving, so as to restore the bit array of the interleaved data D24 and D25 interleaved by the interleaver 32 in the encoding apparatus 1" to the bit array of the original encoded data D22 and D23. The de-interleaver 35 outputs the data obtained by de-interleaving as a priori probability information D32 regarding the code bit in the following soft-output decode circuit 36.

The soft-output decode circuit 36 is provided corresponding to the convolutional encoder 31 in the encoding apparatus 1", and as with the soft-output decode circuit 34, performs MAP decoding based on the BCJR algorithm, Max-Log-BCJR algorithm, or Log-BCJR algorithm. That is to say, the soft-output decode circuit 36 inputs a priori probability information D32 relating to the code bit of the soft-input output from the de-interleaver 35, while also inputting a priori probability information D33 relating to an information bit of which value is "0", and performs soft-output decoding of the inner code by MAP decoding based on the BCJR algorithm, Max-Log-BCJR algorithm, or Log-BCJR algorithm, using the a priori probability information D32 and D33. The soft-output decode circuit 36 generates extrinsic information D34 and D35 obtained by constriction conditions of the code, and externally outputs the extrinsic information D34 as decoded data D36, as well as outputting the extrinsic information D35 to the interleaver 37 as soft-output.

The interleaver 37 performs interleaving based upon the same permuting position information as the interleaver 32 in the encoding apparatus 1", for the extrinsic information D35 regarding the code bit, which is the soft-input, output from the soft-output decode circuit 36. The interleaver 37 outputs the data obtained by interleaving as the a priori probability information D30 regarding the information bits in the soft-output decode circuit 34.

The above-described decoding apparatus 3" comprises soft output decode circuits 36 and 34 corresponding to each of the convolutional encoders 31 and 33 in the encoding apparatus 1", and thus can break down code with a high degree of decoding complexity into components with small complexity, thereby successively improving properties by the interaction between the soft-output decode circuits 34 and 36, as with the decoding apparatus 3'. In the event of receiving the received value D29, the decoding apparatus 3" performs repeated decoding for a predetermined times, and outputs the decoded data D36 based upon the soft-output extrinsic information obtained from the results of the decoding operations.

Note that an encoding apparatus which performs encoding by SCTCM can be realized by comprising a modulator which performs modulation by 8PSK modulation, for example, at the final level of the encoding apparatus 1". Also, a decoding device which performs decoding by SCTCM can be realized by the same configuration as the decoding apparatus 3", to which same-phase components and orthogonal component symbols are directly input as reception values.

The interleaver provided to the encoding apparatus 1 and/or the decoding apparatus 3, will now be described. Here, the de-interleaver permutes data based upon the permuting position information reverse to the interleaver, and accordingly the de-interleaver may be taken as a type of interleaver. Accordingly, in the event that there is no need to differentiate, de-interleavers will be referred to as interleavers, hereafter. That is to say, for example, the interleaver 13 in the above-described encoding apparatus 1' the interleaver 16 or the de-interleaver 18 or 20 in the decoding apparatus 3' the interleaver 32 in the encoding apparatus 1", or the de-interleaver 35 or the interleaver 37 in the decoding apparatus 3", will be generally referred to as interleavers.

As described above, the interleaver performs symmetrical interleaving wherein the permuting from the input data to the output data is symmetrical. That is to say, that the interleaver is the same as the de-interleaver, and accordingly, in the event that the interleaver performs the same permuting for arbitrary input data two times, the interleaver outputs the original input data as the output data thereof. Moreover, in other words, with the permuting matrix of interleaving as "p", an inverse permuting matrix "p−1" exists, and with the unit matrix as "I", the interleaving and the de-interleaving are performed following the same addresses, and accordingly p==p−1 holds, and in the event that the interleaving is performed two times, the data returns to the original sequence, and accordingly pp==I holds.

Moreover, an arrangement may be made wherein the interleaver outputs the input data which is of an even number in order at an even number in order, and also outputs the input data which is of an odd number in order at an odd number, following addresses.

Specifically, let us consider an arrangement wherein data writing and data reading is performed in a storage device such as RAM (Random Access Memory) or the like, of which the number of words corresponds to ten time slots, as an example of realization by hardware. For example, in the event that the data DD0, DD1, DD2, DD3, DD4, DD5, DD6, DD7, DD8, and DD9, is written as the input data in the storage device to which addresses 0, 1, 2, . . . , 9, are assigned, from the left side in a sequential manner as shown in FIG. 6A, the data DD2, DD9, DD0, DD5, DD4, DD3, DD8, DD7, DD6, and DD1, is read out as the output data following addresses as shown in FIG. 6B. On the other hand, for example, in the event that the data DD2, DD9, DD0, DD5, DD4, DD3, DD8, DD7, DD6, DD1, is written as the input data in the storage device from the left side in a sequential manner as shown in FIG. 6B, the data DD0, DD1, DD2, DD3, DD4, DD5, DD6, DD7, DD8, and DD9, is read out as the output data following the addresses, as shown in FIG. 6A.

That is to say, the interleaver can be formed as an arrangement for performing interleaving wherein the permuting from the input data to the output data is symmetrical, and the input data at an arbitrary position wherein, with regard to an integer i which is 2 or greater and integers j and k which are 0 or greater but less than i, the residue from division by i is j, is output as the output data at a position wherein the residue from division by i is k.

Note that, with regard to the above-described symmetrical interleaver which performs symmetrical interleaving as described above, the interleaving wherein data is written in a sequential manner, and the data is read out in a non-sequential manner following addresses, and the interleaving wherein data is written in a non-sequential manner following predetermined addresses, and the data is read out in a sequential manner, can be quite the same.

That is to say, the interleaver performs processing in a manner alternating interleaving operations wherein data is read out in a non-sequential manner following addresses and new data is written at the position at which the former data has just been read out, and de-interleaving operations wherein data is read out in a sequential manner and new data is written at the position at which the former data has just been read out.

Thus, while the interleaver performs interleaving and de-interleaving in a alternating manner, the operation is the same as the operation wherein interleaving is performed successively, since the permuting from the input data to the output data is symmetrical.

As described above, the interleaver has no need to use a storage device having the capacity twice the interleaving length for storing data, rather, a storage device having the same capacity as the interleaving length can be made to suffice, by arranging the reading order and the writing order performed at the same time to be the same.

In the event that the interleaver having the nature is applied to the encoding apparatus 1' and the decoding apparatus 3', and the encoding apparatus 1" and the decoding apparatus 3", these to the encoding apparatus 1' and the decoding apparatus 3', and the encoding apparatus 1" and the decoding apparatus 3", are configured as shown in FIGS. 7 through 10, in a schematic manner, respectively.

Figure 7:
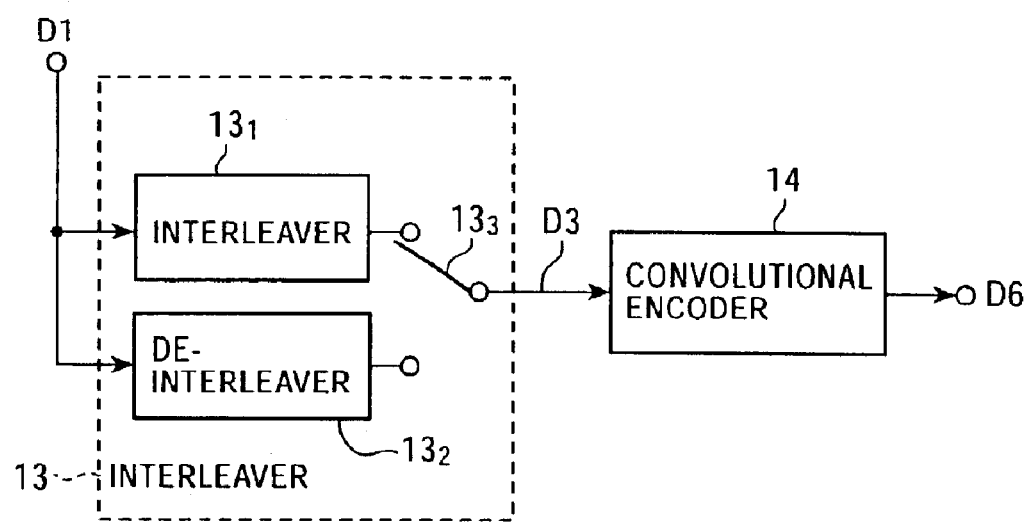
FIG. 7 is a diagram describing the primary concept of the encoding apparatus, for describing the concept of the interleaver applied to the encoding apparatus shown in FIG. 2.

That is to say, the interleaver 13 in the encoding apparatus 1' can be understood as an arrangement consisting of an interleaver 131 which performs the interleaving operation wherein reading out of the input data D1 is performed following addresses, and writes the input data D1 at the position at which the former data has just been read out, a de-interleaver 132 which performs de-interleaving operation wherein reading out of the input data D1 is performed in a sequential manner, and writes the input data D1 at the position at which the former data has just been read out, which is converse to the interleaving operation by the interleaver 131, and a switch 133 for switching the output from the interleaver 131 and the de-interleaver 132 each frame so as to output the interleaved data D3 as the output data, as shown in the primary concept of the encoding apparatus 1' in FIG. 7.

The interleaver 13 can perform interleaving successively by alternating between the interleaving operations made by the interleaver 131 and the de-interleaving operations made by the de-interleaver 132, each frame.

Figure 8A:
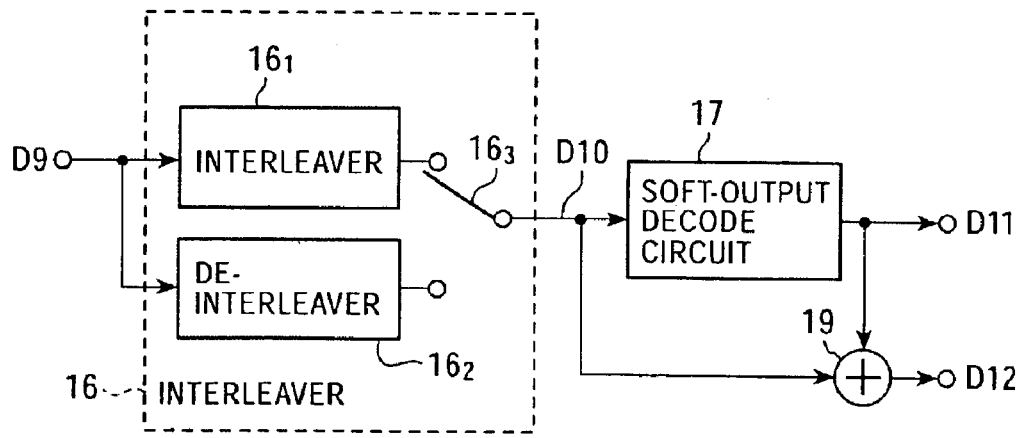
FIGS. 8A through 8C are diagram describing the primary concept of the decoding apparatus, for describing the concept of the interleaver applied to the decoding apparatus shown in FIG. 3, with FIG. 8A illustrating the interleaver which the decoding apparatus comprises, FIG. 8B illustrating the de-interleaver which the decoding apparatus comprises, and FIG. 8C illustrating another de-interleaver which the decoding apparatus comprises.

On the other hand, the interleaver 16 in the decoding apparatus 31 can be understood as an arrangement consisting of an interleaver 161 which performs the same interleaving operation as the above-described interleaver 131 wherein reading out of the above-described extrinsic information D9 is performed following addresses and the extrinsic information D9 is written at the position at which the former data has just been read out, a de-interleaver 162 which performs the same de-interleaving operation as the above-described de-interleaver 132 wherein reading out of the extrinsic information D9 is performed in a sequential manner and the extrinsic information D9 is written at the position at which the former data has just been read out, inversely to the interleaving operation by the interleaver 161, and a switch 163 for switching the output from the interleaver 161 and the de-interleaver 162 each frame so as to output the a priori probability information D10 as the output data, as shown in the primary concept of the decoding apparatus 3' in FIG. 8A.

The interleaver 16 can perform interleaving successively by performing processing by alternating between the interleaving operation by the interleaver 161 and the de-interleaving operation by the de-interleaver 162 each frame.

Figure 8B:
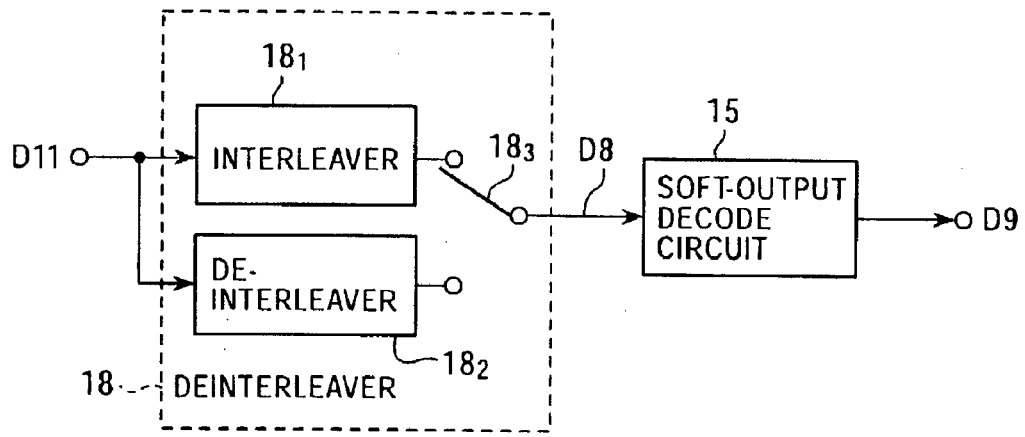

Also, the de-interleaver 18 in the decoding apparatus 3' can be understood as an arrangement consisting of an interleaver 181 which performs the interleaving operation wherein reading out of the above-described extrinsic information D11 is performed following addresses and the extrinsic information D11 is written at the position at which the former data has just been read out, a de-interleaver 182 which performs de-interleaving operation wherein reading out of the extrinsic information D11 is performed in a sequential manner and the extrinsic information D11 is written at the position at which the former data has just been read out, inversely to the interleaving operation by the interleaver 181, and a switch 183 for switching the output from the interleaver 181 and the de-interleaver 182 each frame so as to output the a priori probability information D8 as the output data, as shown in the primary concept of the encoder 3' in FIG. 8B.

The de-interleaver 18 can successively perform de-interleaving of which permuting operation is inverse to the interleavers 13 and 16, by performing processing alternating between the interleaving operation by the interleaver 181 and the de-interleaving operation by the de-interleaver 182, each frame.

Figure 8C:
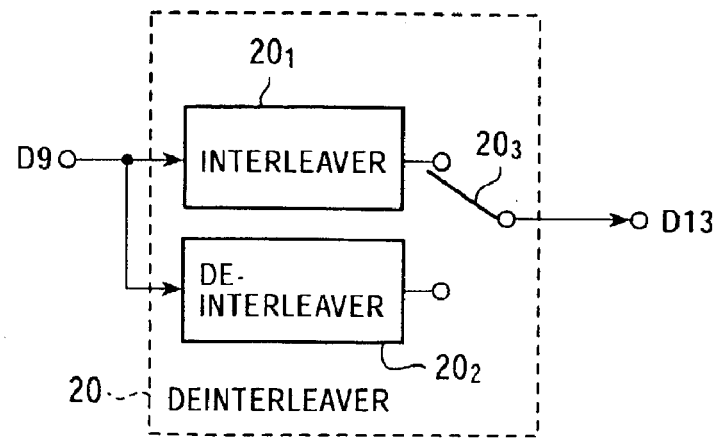

Moreover, the de-interleaver 20 in the decoding apparatus 3' can be understood as an arrangement consisting of an interleaver 201 which performs the interleaving operation wherein reading out of the above-described data D12 is performed following addresses and the data D12 is written at the position at which the former data has just been read out, a de-interleaver 202 which performs the same de-interleaving operation as the above-described de-interleaver 182, wherein reading out of the data D12 is performed in a sequential manner and the data D12 is written at the position at which the former data has just been read out, inversely to the interleaving operation by the interleaver 201, and a switch 203 for switching the output from the interleaver 201 and the de-interleaver 202 each frame so as to output the decoded data D13 as the output data, as shown in the primary concept of the encoder 3' in FIG. 8C.

The de-interleaver 20 can successively perform de-interleaving the same as the de-interleaver 18, by alternating between the interleaving operation by the interleaver 201 and the de-interleaving operation by the de-interleaver 202, each frame.

Figure 9:
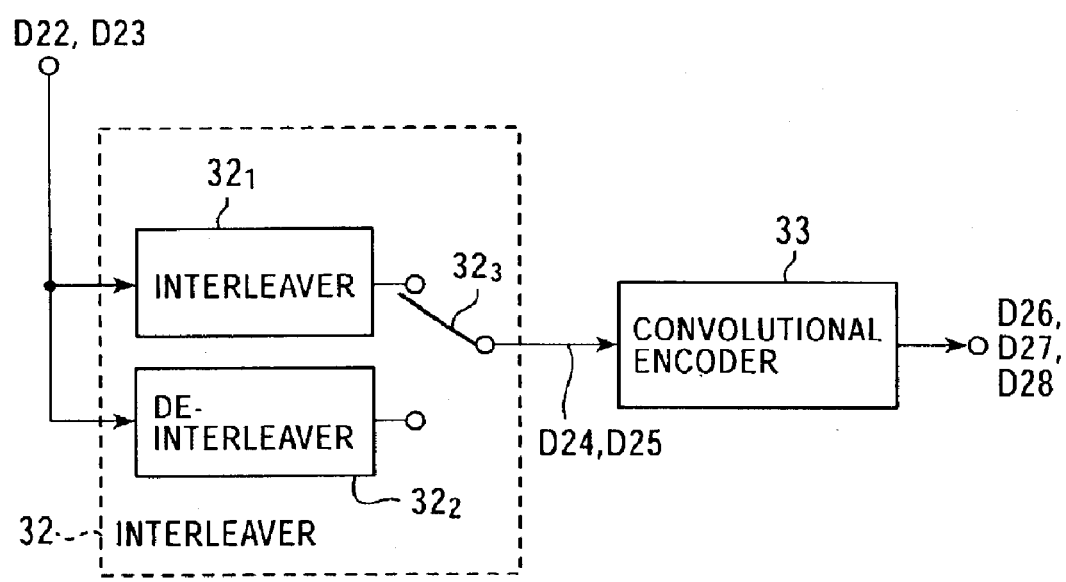
FIG. 9 is a diagram describing the primary concept of the encoding apparatus, for describing the concept of the interleaver applied to the encoding apparatus shown in FIG. 4.

In the same way, the interleaver 32 in the encoding apparatus 1" can be understood as an arrangement consisting of an interleaver 321 which performs the interleaving operation wherein reading out of the encoded data D22 and D23 is performed following addresses and the encoded data D22 and D23 is written at the position at which the former data has just been read out, a de-interleaver 322 which performs de-interleaving operation wherein reading out of the encoded data D22 and D23 is performed in a sequential manner and the encoded data D22 and D23 is written at the position at which the former data has just been read out, inversely to the interleaving operation by the interleaver 321, and a switch 323 for switching the output from the interleaver 321 and the de-interleaver 322 each frame so as to output the above-described interleaved data D24 and D25 as the output data, as shown in the primary concept of the encoding apparatus 1" in FIG. 9.

The interleaver 32 can successively perform interleaving by performing processing alternating between the interleaving operation by the interleaver 321 and the de-interleaving operation by the de-interleaver 322, each frame.

Figure 10A:
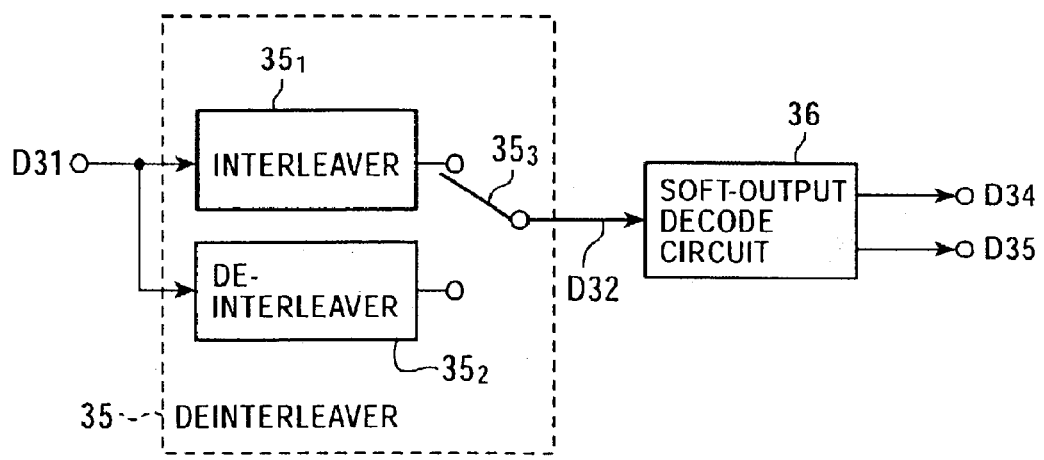
FIGS. 10A and 10B are diagram describing the primary concept of the decoding apparatus, for describing the concept of the interleaver applied to the decoding apparatus shown in FIG. 5, with FIG. 10A illustrating the de-interleaver which the decoding apparatus comprises, and FIG. 10B illustrating the interleaver which the decoding apparatus comprises.

On the other hand, the de-interleaver 35 in the decoding apparatus 3" can be understood as an arrangement consisting of an interleaver 351 which performs the interleaving operation wherein reading out of the extrinsic information D31 is performed following addresses and the extrinsic information D31 is written at the position at which the former data has just been read out, a de-interleaver 352 which performs de-interleaving operation wherein reading out of the extrinsic information D31 is performed in a sequential manner and the extrinsic information D31 is written at the position at which the former data has just been read out, inversely to the interleaving operation by the interleaver 351, and a switch 353 for switching the output from the interleaver 351 and the de-interleaver 352 each frame so as to output the above-described a priori probability information D32 as the output data, as shown in the primary concept of the decoding apparatus 3" in FIG. 10A.

The de-interleaver 35 can successively perform de-interleaving of which the permuting operation is inverse to the interleaver 32, by performing processing alternating between the interleaving operation by the interleaver 351 and the de-interleaving operation by the de-interleaver 352 each frame.

Figure 10B:
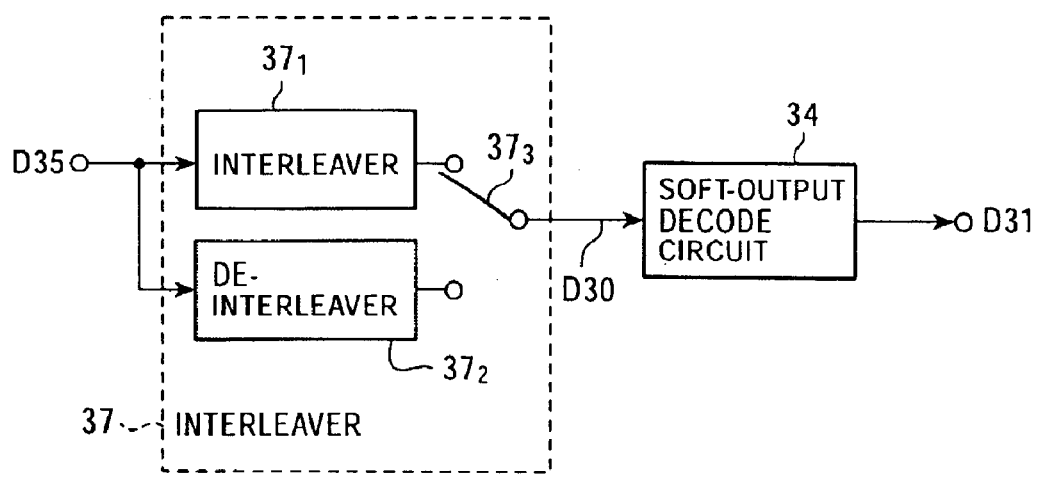

Also, the interleaver 37 in the decoding apparatus 3" can be understood as an arrangement consisting of an interleaver 371 which performs the interleaving operation the same as the interleaver 321, wherein reading out of the extrinsic information D35 is performed following addresses and the extrinsic information D35 is written at the position at which the former data has just been read out, a de-interleaver 372 which performs the de-interleaving operation the same as the above-described de-interleaver 322, wherein reading out of the extrinsic information D35 is performed in a sequential manner and the extrinsic information D35 is written at the position at which the former data has just been read out, inversely to the interleaving operation by the interleaver 371, and a switch 373 for switching the output from the interleaver 371 and the de-interleaver 372 each frame so as to output the above-described a priori probability information D30 as the output data, as shown in the primary concept of the decoding apparatus 3" in FIG. 10B.

The interleaver 37 can successively perform interleaving the same as the interleaver 32, by performing processing alternating between the interleaving operation by the interleaver 371 and the de-interleaving operation by the de-interleaver 372, each frame.

Figure 11:
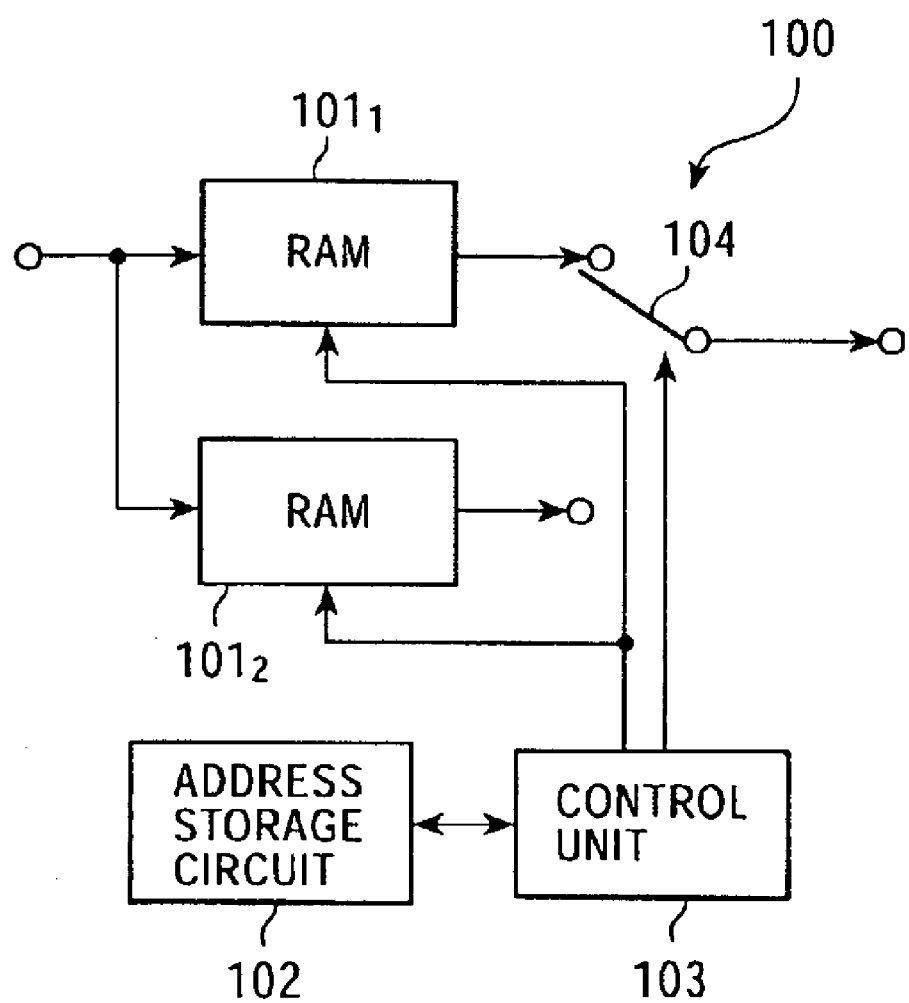
FIG. 11 is a block diagram describing a specific hardware configuration of the interleaver applied to the encoding apparatus and/or the decoding apparatus.

As described above, an interleaver applicable to the encoding apparatus 1' and the decoding apparatus 3', and the encoding apparatus 1" and the decoding apparatus 3" is configured as hardware, as specifically shown in FIG. 11. Let us now say that the interleaving length is the number of words for ten time slots. In the event that the operations, wherein reading out in a sequential manner and the reading out in a non-sequential manner following addresses are performed in an alternating manner, and the next data is written at the position at which the former data has just been read out, are repeated using an i number of storage devices having the capacity of "1/i" of the interleaving length, either reading or writing is performed for the same storage device at the same time, and accordingly, so-called single-port RAM may be used alone as a storage device. In general, the size of single-port RAM is generally half of that of so-called dual-port RAM in the event that the capacities are the same, so the circuit size can be further reduced by using single-port RAM as compared with arrangement using dual-port RAM. Accordingly, in the interleaver 100 shown in the drawing, the single-port RAM is assumed to be used as a storage device for writing and reading out of data.

That is to say, for example, the interleaver 100 includes two banks of single-port RAM 1011 and 1012, an address storage circuit 102 for holding address data for permuting, a control unit 103 for controlling writing and reading out of data in the RAM 1011 and 1012 based upon the address data which is read out with reference to the address storage circuit 102, and a switch 104 for switching the output from the RAM 1011 and 1012 each one time slot, based upon the control of the control unit 103, as shown in the drawing.

The RAM 1011 and 1012 each have capacity half of the interleaving length. The RAM 1011 and 1012 each alternately receive input of input data each time slot, under control of the control unit 103. Data is written to addresses specified by the control unit 103 in each of the RAM 1011 and 1012. Also, the RAM 1011 and 1012 each alternately output the output data each time slot, under control of the control unit 103. At this time, data is read from addresses specified by the control unit 103 in each of the RAM 1011 and 1012.

The address storage circuit 102 is configured so as to be capable of writing arbitrary interleaving patterns, and while no shown in the drawings, the address storage circuit 102 has multiple banks of RAM, a selection circuit, and so forth, for example, and holds the permuting position information of data referred to by the control unit 103 as address data. Here, the interleaver 100 performs sequential reading and reading following addresses, so the address storage circuit 102 holds two types of permuting position information, but of these two types of permuting position information, addresses for sequential reading can be dealt with by following sequential addresses generated by incrementing or decrement following a counter, so in reality, only one type of permuting position information needs to be held. The address data held in the address storage circuit 102 is read out by the addresses in the address storage circuit 102 being specified by the control unit 103 as address data.

Upon detecting the head of the frame, for example, the control unit 103 controls the writing and reading of data to and from the RAM 1011 and 1012 by making reference to the address data held in the address storage circuit 102. Specifically, in order to realize the action of writing data to a position from which data has been read from the RAM 1011 and 1012 immediately before, the control unit 103 effects control of writing and reading of data to and from the RAM 1011 and 1012, so as to delay the address used for reading from one of the RAM 1011 or 1012 by supplying an address to each of the RAM 1011 and 1012 by one time slot using an unshown register, and write to the same one of the RAM 1011 and 1012 in the next time slot using this address, and supplies control signals to the switch 104 for selectively switching between output data output from each of the RAM 1011 and 1012 for each time slot. Viewing this action from each of the RAM 1011 and 1012, during 2 time slots, the same address is input, with data being read out at the first time slot thereof, and data being written to that address in the second time slot. At each frame, the control unit 103 switches between performing such an action sequentially or according to a predetermined non-sequential pattern. That is to say, each frame, the control unit 103 switches between reading out of data following a predetermined non-sequential address and writing data to this address at a time delayed by one time slot, and reading out of data following a sequential address and writing data to this address at a time delayed by one time slot.

The switch 104 switches the output data output from each of the RAM 1011 and 1012 each time slot, based on control signals supplied from the control unit 103.

With such an interleaver 100, upon data being read out from a predetermined address at one of the RAM 1011 and 1012 and data being written to a predetermined address at the other of the RAM 1011 and 1012 under control of the control unit 103 with regard to a certain frame, in the next frame data is written to the address used for reading data from one of the RAM 1011 and 1012, as well as data being read out from the predetermined address in the other of the RAM 1011 and 1012.

Specifically, as shown in FIGS. 12 through 19, the interleaver 100 realizes interleaving by writing and reading data. Here, of the two banks, the RAM 1011 shown at the upper side in the diagram will be referred to bank A and the RAM 1012 shown at the lower side will be referred to bank B, to facilitate description. Also, here, the RAM 1011 and 1012 are each assigned addresses 0, 1, 2, 3, 4 from the left side in the diagram. Further, in the diagrams, W represents writing of data, and R represents reading thereof.

First, the interleaver 100 writes the first frame of data to the RAM 1011 and 1012.

Figure 12:
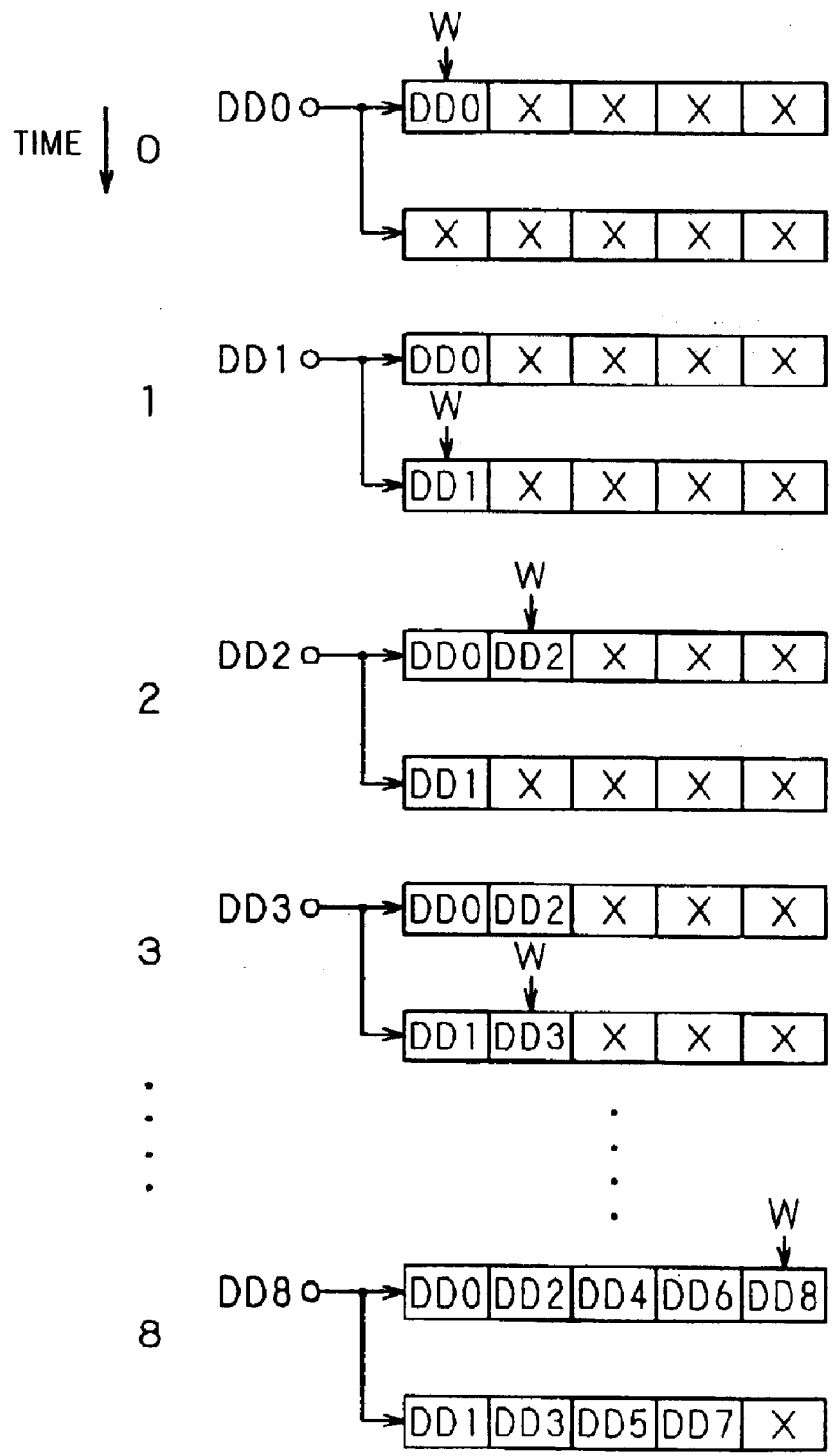
FIG. 12 is a diagram describing the actions of the interleaver writing and reading data, and describes the manner wherein, of data in a first frame, all data except for the last data is written to RAM.

That is, as shown in FIG. 12, in the 0th time slot, the interleaver 100 writes the data DD0 to the storage area of the address 0 of the bank A RAM 1011. Next, in the 1st time slot, the interleaver 100 writes the data DD1 to the storage area of the address 0 of the bank B RAM 1012. Next, in the 2nd time slot, the interleaver 100 writes the data DD2 to the storage area of the address 1 of the bank A RAM 1011, and in the 3rd time slot, writes the data DD3 to the storage area of the address 1 of the bank B RAM 1012. In the same way, the interleaver 100 alternately writes data to the storage areas of each address in the bank A RAM 1011 and the storage areas of each address in the bank B RAM 1012 for each time slot, and in the 8th time slot, writes the data DD8 to the storage area of the address 4 of the bank A RAM 1011.

Thus, the interleaver 100 writes all of the data of the first frame except for the last data DD9, i.e., the data DD0, DD1, DD2, DD3, DD4, DD5, DD6, DD7, and DD8, in that order, to the RAM 1011 and 1012.

Subsequently, the interleaver 100 writes the remaining data DD9 of the 1st frame and the data of the 2nd frame to the RAM 1011 and 1012, and reads out the data of the 1st frame which has been written to the RAM 1011 and 1012 in a different order from the order in which it was written.

Figure 13:
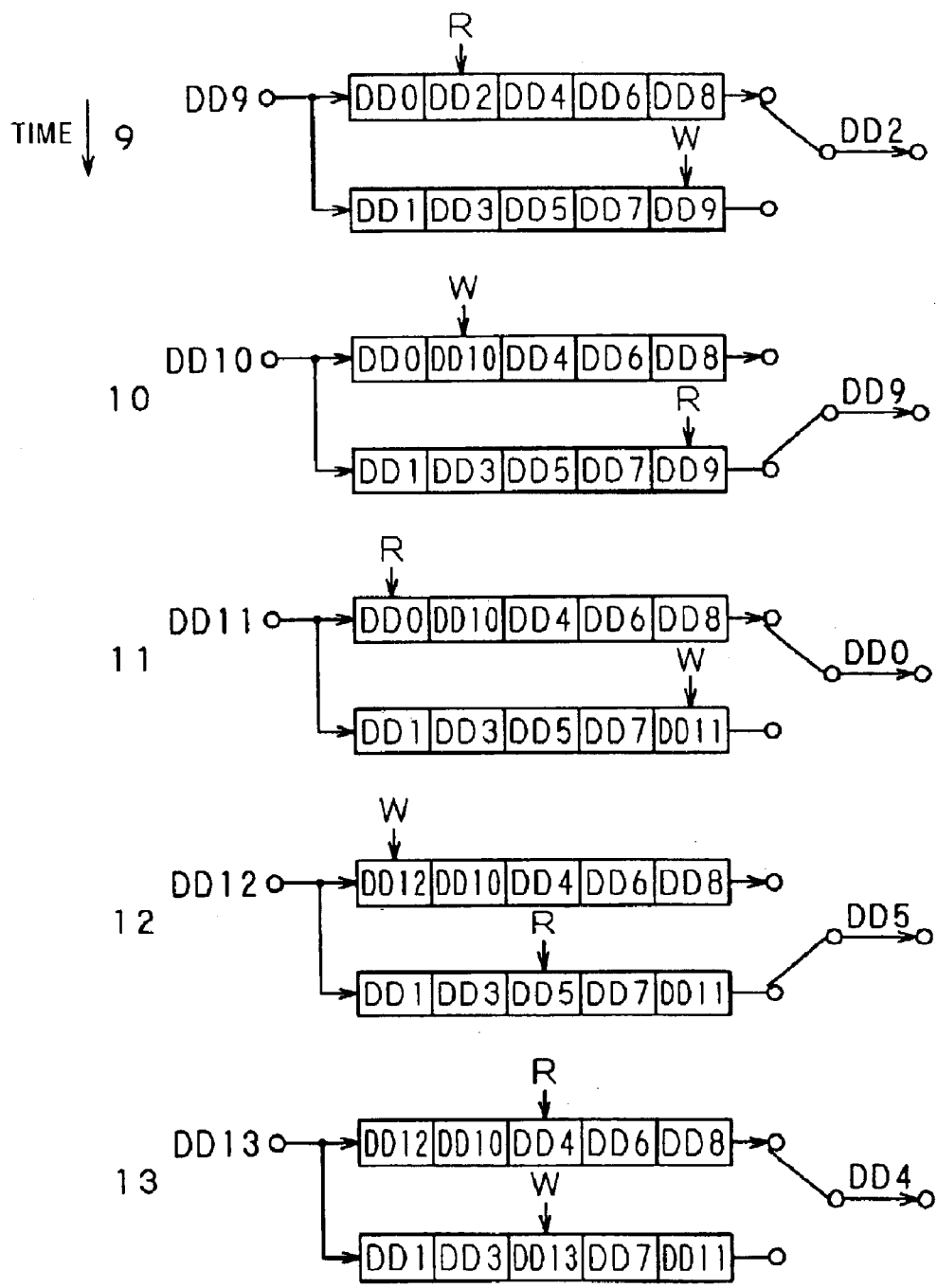
FIG. 13 is a diagram describing the actions of the interleaver writing and reading data following the state shown in FIG. 12, and describes the manner wherein the last data of the first frame and partway through the data in the second frame is written to the RAM, while the data of the first frame which has been written to the RAM is read out in a different order from which it was written.

That is, as shown in FIG. 13, in the 9th time slot, the interleaver 100 writes the data DD9 to the storage area of the address 4 of the bank B RAM 1012, and also reads out the data DD2 from the storage area of the address 1 in the bank A RAM 1011, i.e., the storage area where the data DD2 was written in the 2nd time slot. Next, in the 10th time slot, the interleaver 100 reads out the data DD9 from the storage area of the address 4 in the bank B RAM 1012, i.e., the storage area where the data DD9 was written in the 9th time slot, and also writes the data DD10 to the storage area of the address 1 of the bank A RAM 1011, i.e., the storage area from which the data DD2 has been read out in the immediately preceding 9th time slot and now is empty. Next, in the 11th time slot, the interleaver 100 reads out the data DD0 from the storage area of the address 0 in the bank A RAM 1011, i.e., the storage area where the data DD0 was written in the 0th time slot, and also writes the data DD11 to the storage area of the address 4 of the bank B RAM 1012, i.e., the storage area from which the data DD9 has been read out in the immediately preceding 10th time slot and now is empty. Next, in the 12th time slot, the interleaver 100 reads out the data DD5 from the storage area of the address 2 in the bank B RAM 1012, i.e., the storage area where the data DD5 was written in the 5th time slot, and also writes the data DD12 to the storage area of the address 0 of the bank A RAM 1011, i.e., the storage area from which the data DD0 has been read out in the immediately preceding 11th time slot and now is empty. Next, in the 13th time slot, the interleaver 100 reads out the data DD4 from the storage area of the address 2 in the bank A RAM 1011, i.e., the storage area where the data DD4 was written in the 4th time slot, and also writes the data DD13 to the storage area of the address 2 of the bank B RAM 1012, i.e., the storage area from which the data DD5 has been read out in the immediately preceding 12th time slot and now is empty.

Figure 14:
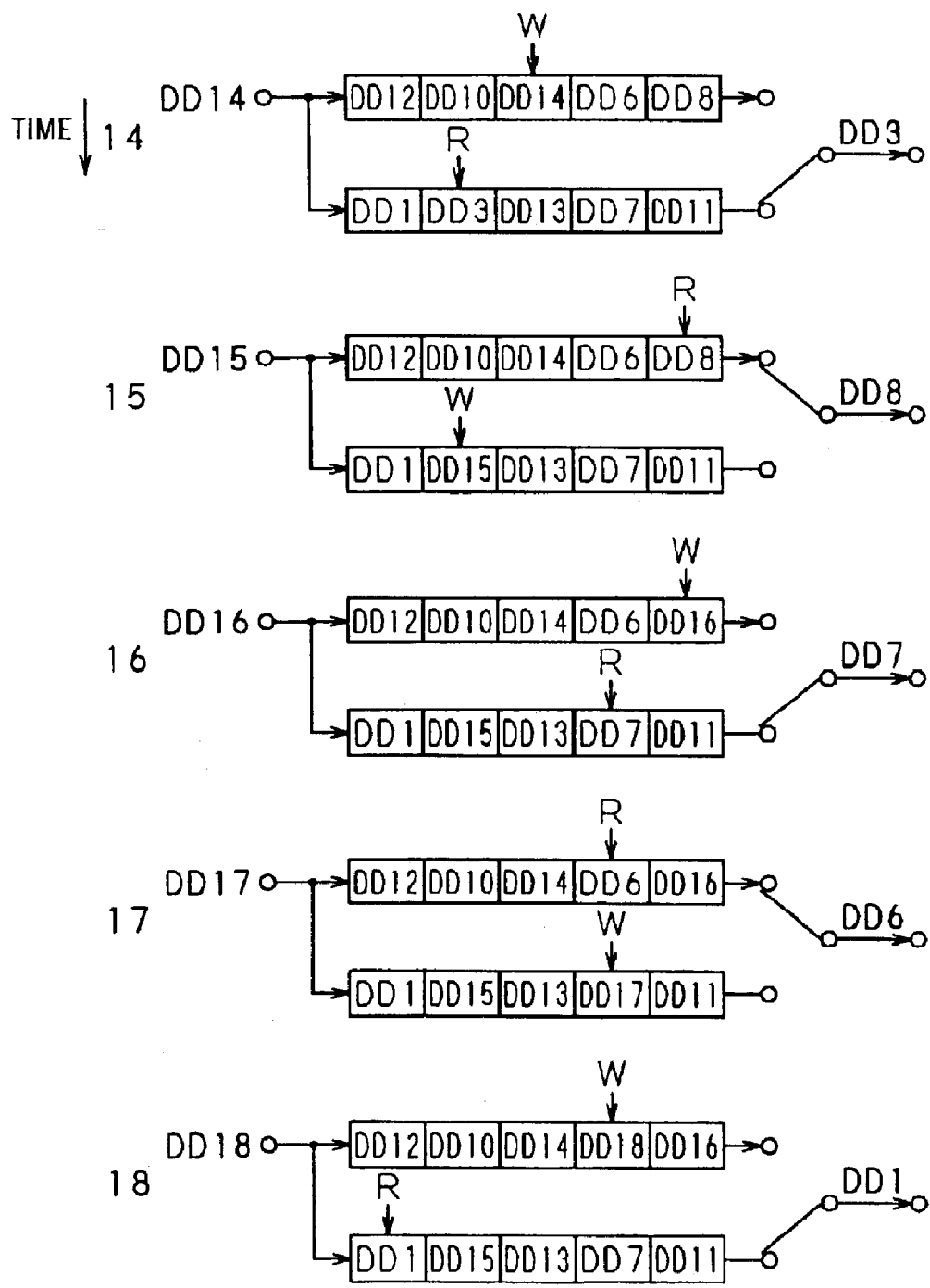
FIG. 14 is a diagram describing the actions of the interleaver writing and reading data following the state shown in FIG. 13, and describes the manner wherein, of data of the second frame, the remaining data except for the last data is written to the RAM, while the data of the first frame which has been written to the RAM is read out in a different order from which it was written.

Further, as shown in FIG. 14, in the 14th time slot, the interleaver 100 reads out the data DD3 from the storage area of the address 1 in the bank B RAM 1012, i.e., the storage area where the data DD3 was written in the 3rd time slot, and also writes the data DD14 to the storage area of the address 2 of the bank A RAM 1011, i.e., the storage area from which the data DD4 has been read out in the immediately preceding 13th time slot and now is empty. Next, in the 15th time slot, the interleaver 100 reads out the data DD8 from the storage area of the address 4 in the bank A RAM 1011, i.e., the storage area where the data DD8 was written in the 8th time slot, and also writes the data DD15 to the storage area of the address 1 of the bank B RAM 1012, i.e., the storage area from which the data DD3 has been read out in the immediately preceding 14th time slot and now is empty. Next, in the 16th time slot, the interleaver 100 reads out the data DD7 from the storage area of the address 3 in the bank B RAM 1012, i.e., the storage area where the data DD7 was written in the 7th time slot, and also writes the data DD16 to the storage area of the address 4 of the bank A RAM 1011, i.e., the storage area from which the data DD8 has been read out in the immediately preceding 15th time slot and now is empty. Next, in the 17th time slot, the interleaver 100 reads out the data DD6 from the storage area of the address 3 in the bank A RAM 1011, i.e., the storage area where the data DD6 was written in the 6th time slot, and also writes the data DD17 to the storage area of the address 3 of the bank B RAM 1012, i.e., the storage area from which the data DD7 has been read out in the immediately preceding 16th time slot and now is empty. Next, in the 18th time slot, the interleaver 100 reads out the data DD1 from the storage area of the address 0 in the bank B RAM 1012, i.e., the storage area where the data DD1 was written in the 1st time slot, and also writes the data DD18 to the storage area of the address 3 of the bank A RAM 1011, i.e., the storage area from which the data DD6 has been read out in the immediately preceding 17th time slot and now is empty.

Thus, the interleaver 100 reads out from the RAM 1011 and 1012 all of the 1st frame of data written in the order of DD0, DD1, DD2, DD3, DD4, DD5, DD6, DD7, DD8, and DD9, in an order differing from the writing order, i.e., DD2, DD9, DD0, DD5, DD4, DD3, DD8, DD7, DD6, and DD1, while writing to the RAM 1011 and 1012 all of the data of the 2nd frame except for the last data DD19, in the order of DD10, DD11, DD12, DD13, DD14, DD15, DD16, DD17, and DD18.

Next, the interleaver 100 writes the remaining data DD19 of the 2nd frame and the data of the 3rd frame to the RAM 1011 and 1012, while reading out the 2nd frame of data written to the RAM 1011 and 1012 in an order different from the order in which it was written.

Figure 15:
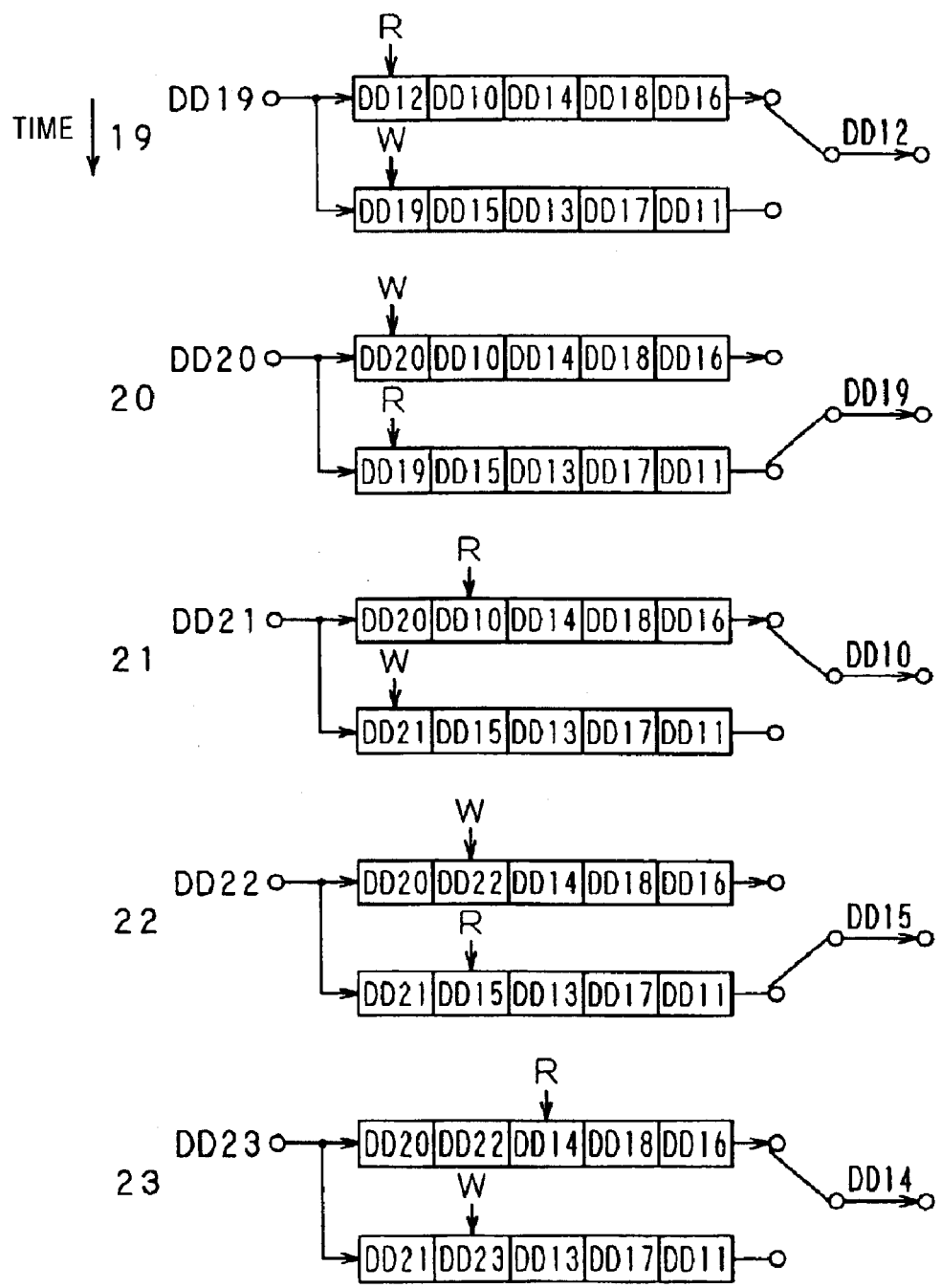
FIG. 15 is a diagram describing the actions of the interleaver writing and reading data following the state shown in FIG. 14, and describes the manner wherein the last data of the second frame and partway through the data in the third frame is written to the RAM, while the data of the second frame which has been written to the RAM is read out in a different order from which it was written.

That is, as shown in FIG. 15, in the 19th time slot, the interleaver 100 reads out the data DD12 from the storage area of the address 0 in the bank A RAM 1011, i.e., the storage area where the data DD12 was written in the 12th time slot, and also writes the data DD19 to the storage area of the address 0 of the bank B RAM 1012, i.e., the storage area from which the data DD1 has been read out in the immediately preceding 18th time slot and now is empty. Next, in the 20th time slot, the interleaver 100 reads out the data DD19 from the storage area of the address 0 in the bank B RAM 1012, i.e., the storage area where the data DD19 was written in the 19th time slot, and also writes the data DD20 to the storage area of the address 0 of the bank A RAM 1011, i.e., the storage area from which the data DD12 has been read out in the immediately preceding 19th time slot and now is empty. Next, in the 21st time slot, the interleaver 100 reads out the data DD10 from the storage area of the address 1 in the bank A RAM 1011, i.e., the storage area where the data DD10 was written in the 10th time slot, and also writes the data DD21 to the storage area of the address 0 of the bank B RAM 1012, i.e., the storage area from which the data DD19 has been read out in the immediately preceding 20th time slot and now is empty. Next, in the 22nd time slot, the interleaver 100 reads out the data DD15 from the storage area of the address 1 in the bank B RAM 1012, i.e., the storage area where the data DD15 was written in the 15th time slot, and also writes the data DD22 to the storage area of the address 1 of the bank A RAM 1011, i.e., the storage area from which the data DD10 has been read out in the immediately preceding 21st time slot and now is empty. Next, in the 23rd time slot, the interleaver 100 reads out the data DD14 from the storage area of the address 2 in the bank A RAM 1011, i.e., the storage area where the data DD14 was written in the 14th time slot, and also writes the data DD23 to the storage area of the address 1 of the bank B RAM 1012, i.e., the storage area from which the data DD15 has been read out in the immediately preceding 22nd time slot and now is empty.

Figure 16:
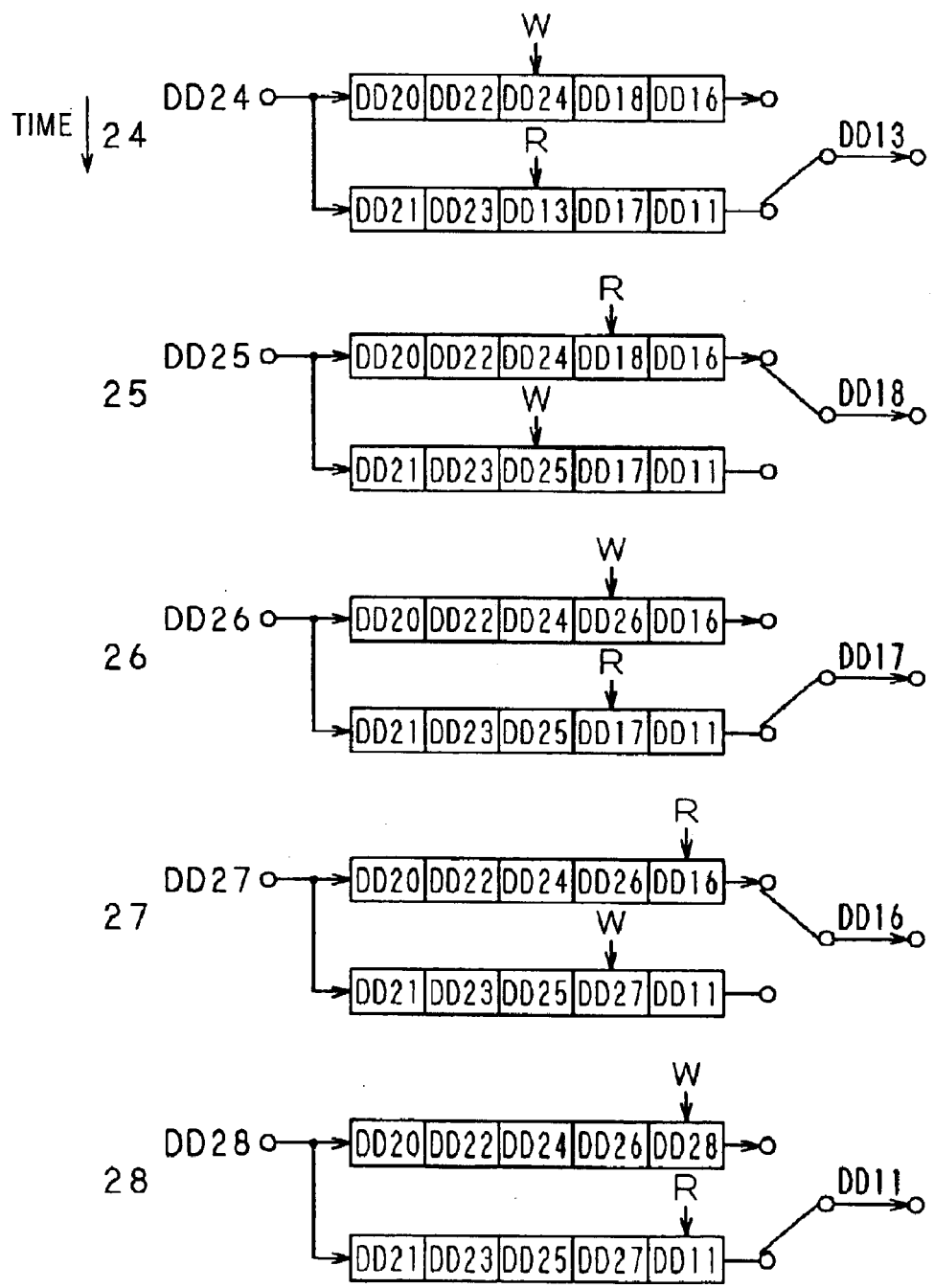
FIG. 16 is a diagram describing the actions of the interleaver writing and reading data following the state shown in FIG. 15, and describes the manner wherein, of data of the third frame, the remaining data except for the last data is written to the RAM, while the data of the second frame which has been written to the RAM is read out in a different order from which it was written.

Further, as shown in FIG. 16, in the 24th time slot, the interleaver 100 reads out the data DD13 from the storage area of the address 2 in the bank B RAM 1012, i.e., the storage area where the data DD13 was written in the 13th time slot, and also writes the data DD24 to the storage area of the address 2 of the bank A RAM 1011, i.e., the storage area from which the data DD14 has been read out in the immediately preceding 23rd time slot and now is empty. Next, in the 25th time slot, the interleaver 100 reads out the data DD18 from the storage area of the address 3 in the bank A RAM 1011, i.e., the storage area where the data DD18 was written in the 18th time slot, and also writes the data DD25 to the storage area of the address 2 of the bank B RAM 1012, i.e., the storage area from which the data DD13 has been read out in the immediately preceding 24th time slot and now is empty. Next, in the 26th time slot, the interleaver 100 reads out the data DD17 from the storage area of the address 3 in the bank B RAM 1012, i.e., the storage area where the data DD17 was written in the 17th time slot, and also writes the data DD26 to the storage area of the address 3 of the bank A RAM 1011, i.e., the storage area from which the data DD18 has been read out in the immediately preceding 25th time slot and now is empty. Next, in the 27th time slot, the interleaver 100 reads out the data DD16 from the storage area of the address 4 in the bank A RAM 1011, i.e., the storage area where the data DD16 was written in the 16th time slot, and also writes the data DD27 to the storage area of the address 3 of the bank B RAM 1012, i.e., the storage area from which the data DD17 has been read out in the immediately preceding 26th time slot and now is empty. Next, in the 28th time slot, the interleaver 100 reads out the data DD11 from the storage area of the address 4 in the bank B RAM 1012, i.e., the storage area where the data DD11 was written in the 11th time slot, and also writes the data DD26 to the storage area of the address 4 of the bank A RAM 1011, i.e., the storage area from which the data DD16 has been read out in the immediately preceding 27th time slot and now is empty.

Thus, the interleaver 100 reads out from the RAM 1011 and 1012 all of the 2nd frame of data written in the order of DD10, DD11, DD12, DD13, DD14, DD15, DD16, DD17, DD18, and DD19, in an order differing from the writing order, i.e., DD12, DD19, DD10, DD15, DD14, DD13, DD18, DD17, DD16, and DD11, while writing to the RAM 1011 and 1012 all of the data of the 3rd frame except for the last data DD29, in the order of DD20, DD21, DD22, DD23, DD24, DD25, DD26, DD27, and DD28.

Next, the interleaver 100 writes the remaining data DD29 of the 3rd frame and the data of the 4th frame to the RAM 1011 and 1012, while reading out the 3rd frame of data written to the RAM 1011 and 1012 in an order different from the order in which it was written.

Figure 17:
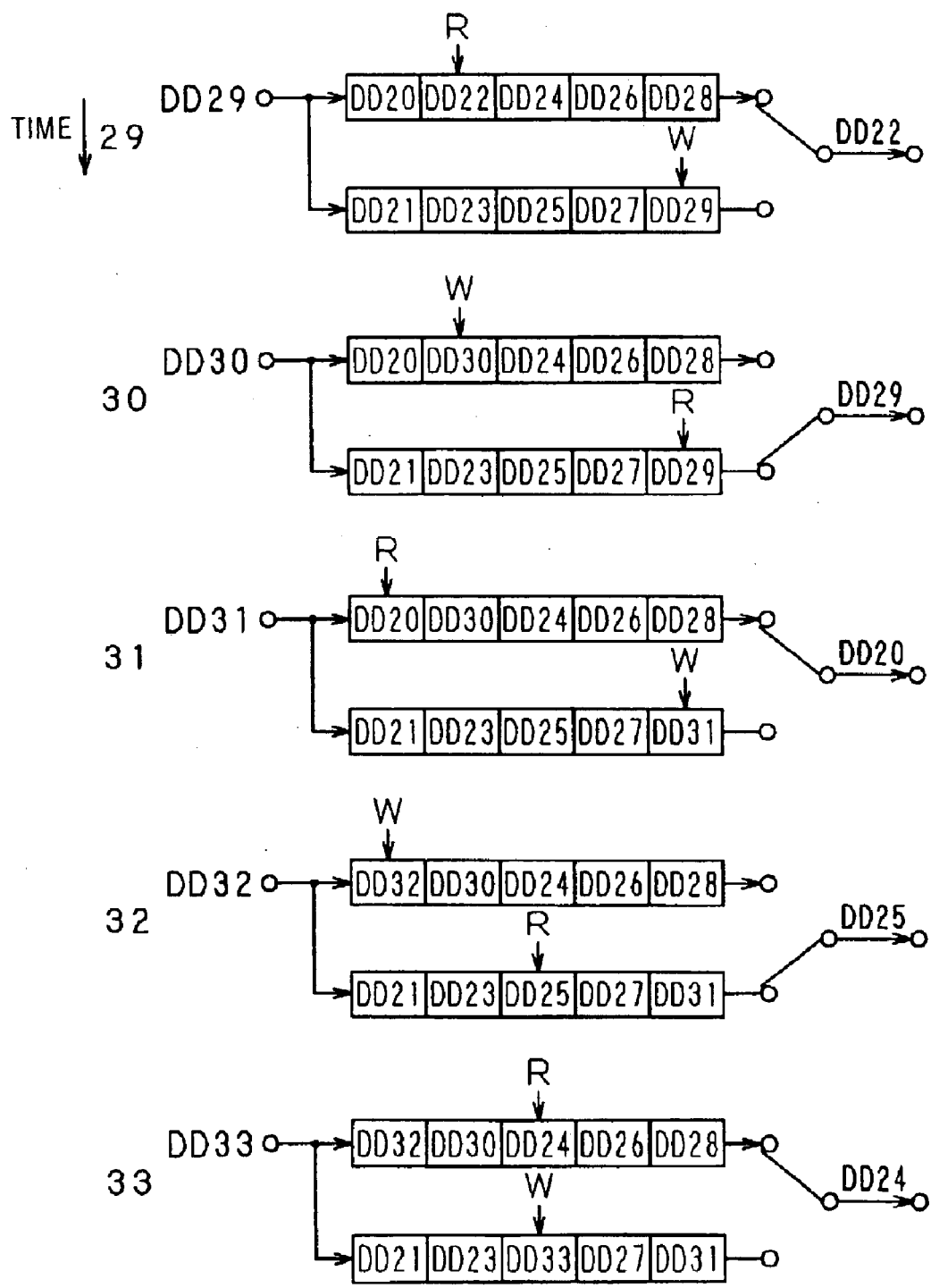
FIG. 17 is a diagram describing the actions of the interleaver writing and reading data following the state shown in FIG. 16, and describes the manner wherein the last data of the third frame and partway through the data in the fourth frame is written to the RAM, while the data of the third frame which has been written to the RAM is read out in a different order from which it was written.

That is, as shown in FIG. 17, in the 29th time slot, the interleaver 100 reads out the data DD22 from the storage area of the address 1 in the bank A RAM 1011, i.e., the storage area where the data DD22 was written in the 22nd time slot, and also writes the data DD29 to the storage area of the address 4 of the bank B RAM 1012, i.e., the storage area from which the data DD11 has been read out in the immediately preceding 28th time slot and now is empty. Next, in the 30th time slot, the interleaver 100 reads out the data DD29 from the storage area of the address 4 in the bank B RAM 1012, i.e., the storage area where the data DD29 was written in the 29th time slot, and also writes the data DD30 to the storage area of the address 1 of the bank A RAM 1011, i.e., the storage area from which the data DD22 has been read out in the immediately preceding 29th time slot and now is empty. Next, in the 31st time slot, the interleaver 100 reads out the data DD20 from the storage area of the address 0 in the bank A RAM 1011, i.e., the storage area where the data DD20 was written in the 20th time slot, and also writes the data DD31 to the storage area of the address 4 of the bank B RAM 1012, i.e., the storage area from which the data DD29 has been read out in the immediately preceding 30th time slot and now is empty. Next, in the 32nd time slot, the interleaver 100 reads out the data DD25 from the storage area of the address 2 in the bank B RAM 1012, i.e., the storage area where the data DD25 was written in the 25th time slot, and also writes the data DD32 to the storage area of the address 0 of the bank A RAM 1011, i.e., the storage area from which the data DD20 has been read out in the immediately preceding 31st time slot and now is empty. Next, in the 33rd time slot, the interleaver 100 reads out the data DD24 from the storage area of the address 2 in the bank A RAM 1011, i.e., the storage area where the data DD24 was written in the 24th time slot, and also writes the data DD33 to the storage area of the address 2 of the bank B RAM 1012, i.e., the storage area from which the data DD25 has been read out in the immediately preceding 32nd time slot and now is empty.

Figure 18:
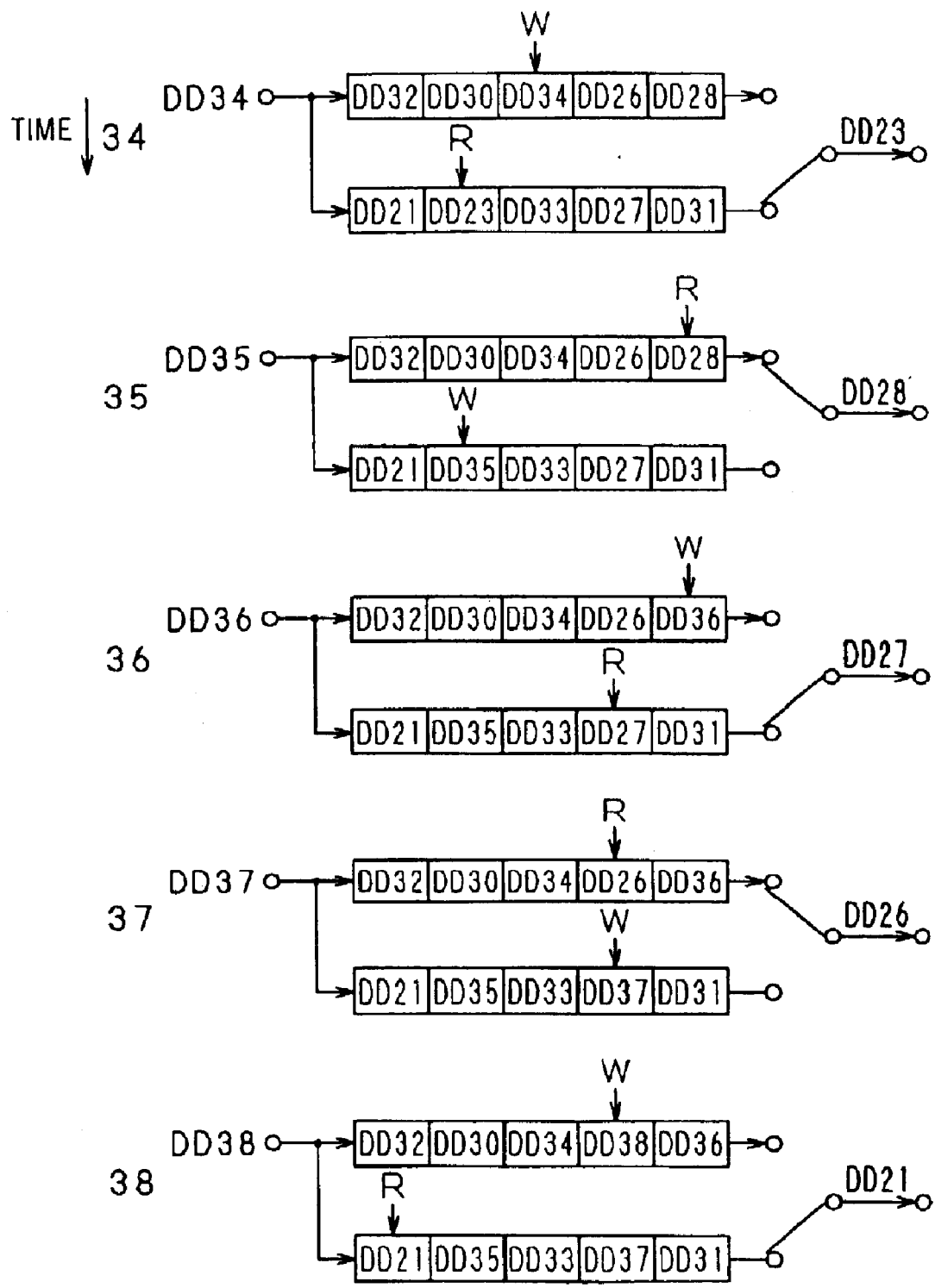
FIG. 18 is a diagram describing the actions of the interleaver writing and reading data following the state shown in FIG. 17, and describes the manner wherein, of data of the fourth frame, the remaining data except for the last data is written to the RAM, while the data of the third frame which has been written to the RAM is read out in a different order from which it was written.

Further, as shown in FIG. 18, in the 34th time slot, the interleaver 100 reads out the data DD23 from the storage area of the address 1 in the bank B RAM 1012, i.e., the storage area where the data DD23 was written in the 23rd time slot, and also writes the data DD34 to the storage area of the address 2 of the bank A RAM 1011, i.e., the storage area from which the data DD24 has been read out in the immediately preceding 33rd time slot and now is empty. Next, in the 35th time slot, the interleaver 100 reads out the data DD28 from the storage area of the address 4 in the bank A RAM 1011, i.e., the storage area where the data DD28 was written in the 28th time slot, and also writes the data DD35 to the storage area of the address 1 of the bank B RAM 1012, i.e., the storage area from which the data DD23 has been read out in the immediately preceding 34th time slot and now is empty. Next, in the 36th time slot, the interleaver 100 reads out the data DD27 from the storage area of the address 3 in the bank B RAM 1012, i.e., the storage area where the data DD27 was written in the 27th time slot, and also writes the data DD36 to the storage area of the address 4 of the bank A RAM 1011, i.e., the storage area from which the data DD28 has been read out in the immediately preceding 35th time slot and now is empty. Next, in the 37th time slot, the interleaver 100 reads out the data DD26 from the storage area of the address 3 in the bank A RAM 1011, i.e., the storage area where the data DD26 was written in the 26th time slot, and also writes the data DD37 to the storage area of the address 3 of the bank B RAM 1012, i.e., the storage area from which the data DD27 has been read out in the immediately preceding 36th time slot and now is empty. Next, in the 38th time slot, the interleaver 100 reads out the data DD21 from the storage area of the address 0 in the bank B RAM 1012, i.e., the storage area where the data DD21 was written in the 21st time slot, and also writes the data DD38 to the storage area of the address 3 of the bank A RAM 1011, i.e., the storage area from which the data DD26 has been read out in the immediately preceding 37th time slot and now is empty.

Thus, the interleaver 100 reads out from the RAM 1011 and 1012 all of the 3rd frame of data written in the order of DD20, DD21, DD22, DD23, DD24, DD25, DD26, DD27, DD28, and DD29, in an order differing from the writing order, i.e., DD22, DD29, DD20, DD25, DD24, DD23, DD28, DD27, DD26, and DD21, while writing to the RAM 1011 and 1012 all of the data of the 4th frame except for the last data DD39, in the order of DD30, DD31, DD32, DD33, DD34, DD35, DD36, DD37, and DD38.

In the same way, the interleaver 100 writes the remaining data DD39 of the 4th frame and the data of the 5th frame to the RAM 1011 and 1012, while reading out the 4th frame of data written to the RAM 1011 and 1012 in an order different from the order in which it was written.

Figure 19:
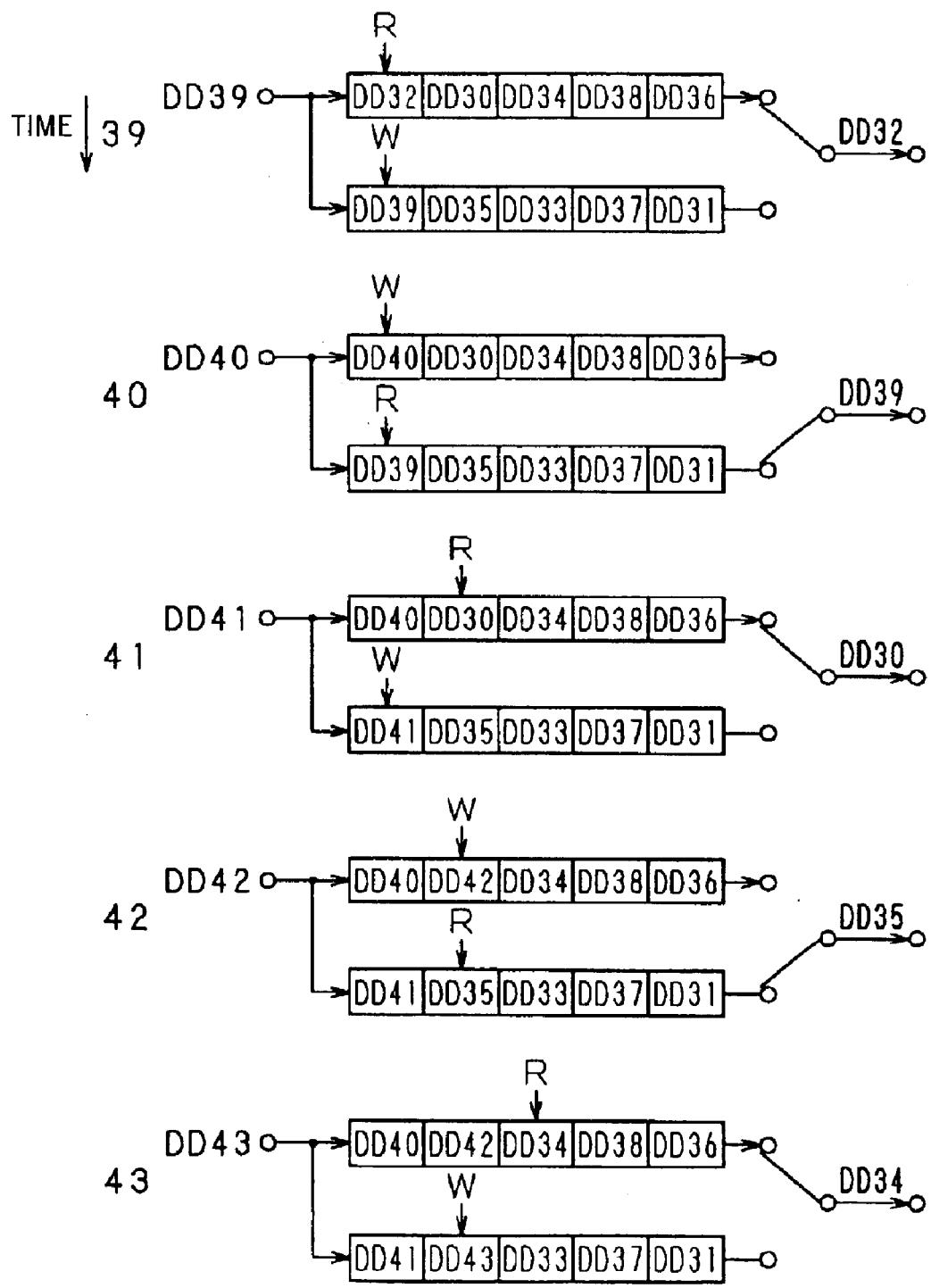
FIG. 19 is a diagram describing the actions of the interleaver writing and reading data following the state shown in FIG. 18, and describes the manner wherein the last data of the fourth frame and partway through the data in the fifth frame is written to the RAM, while the data of the fourth frame which has been written to the RAM is read out in a different order from which it was written.
Figure 20:
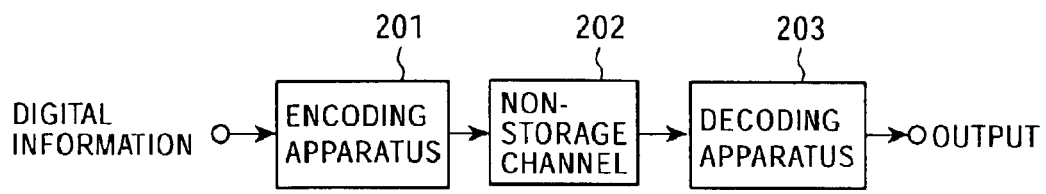
FIG. 20 is a block diagram describing the configuration of a communication model.
Figure 21:
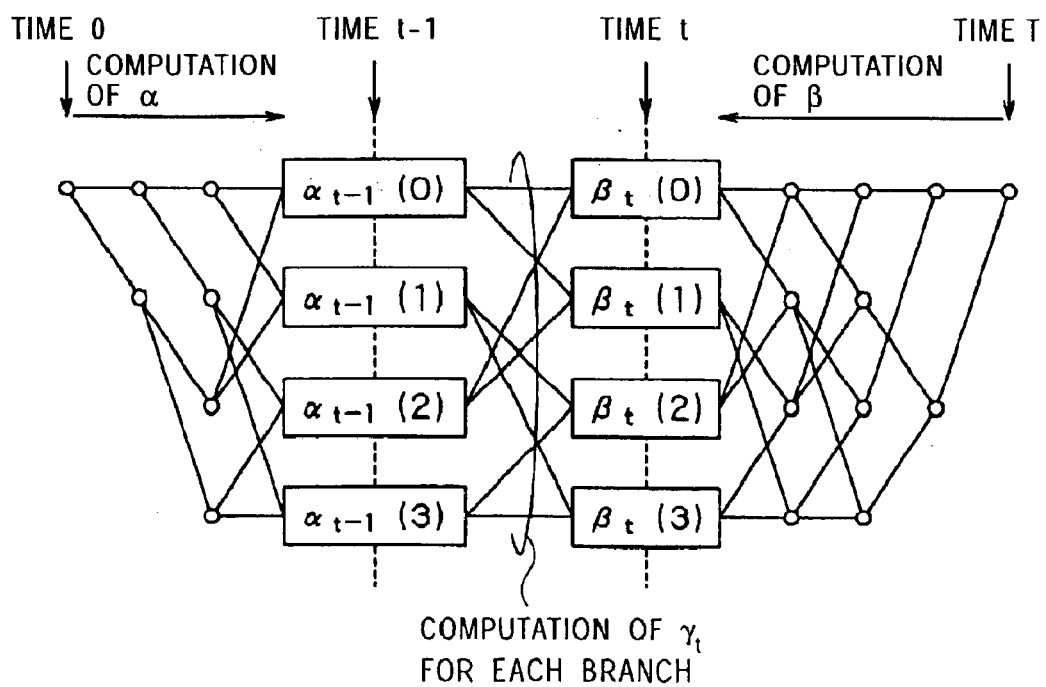
FIG. 21 is a diagram describing a trellis in a conventional encoding apparatus, describing the contents of probabilities $\alpha$, $\beta$, and $\gamma$.
Figure 22:
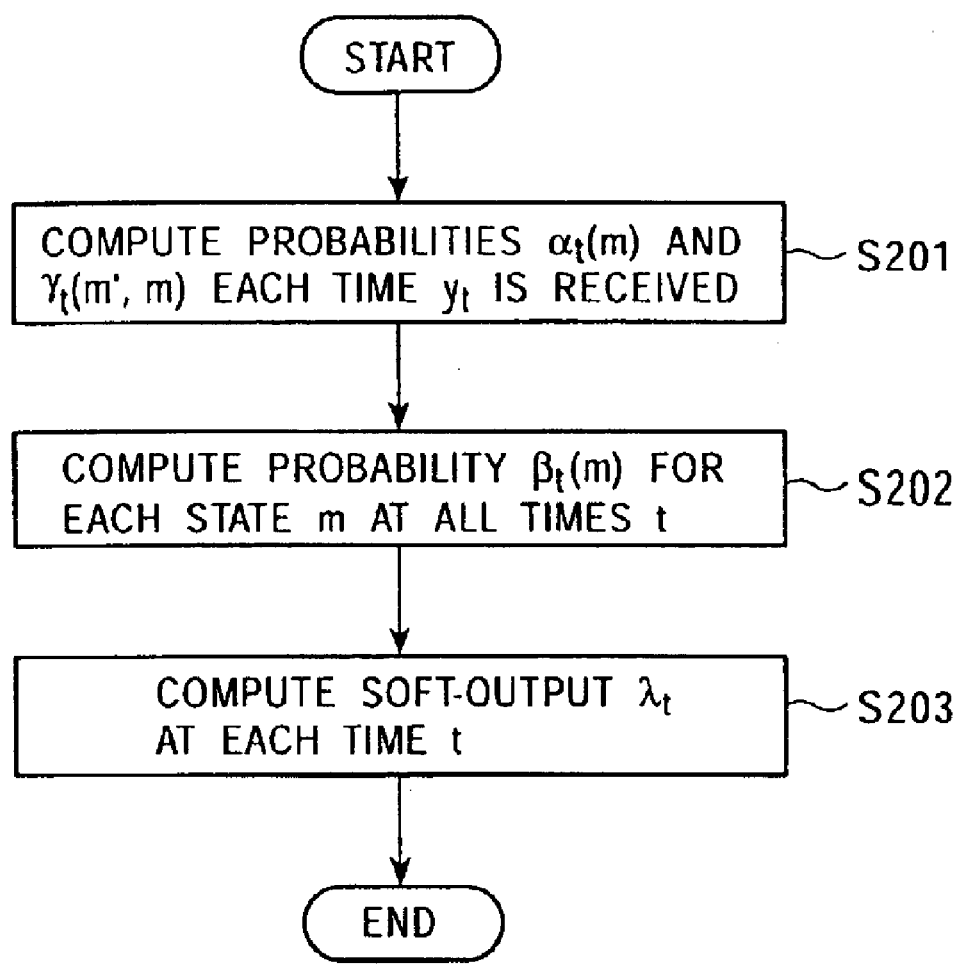
FIG. 22 is a flowchart illustrating a series of steps for performing soft-output decoding by application of the BCJR algorithm with a conventional decoding apparatus.
Figure 23:
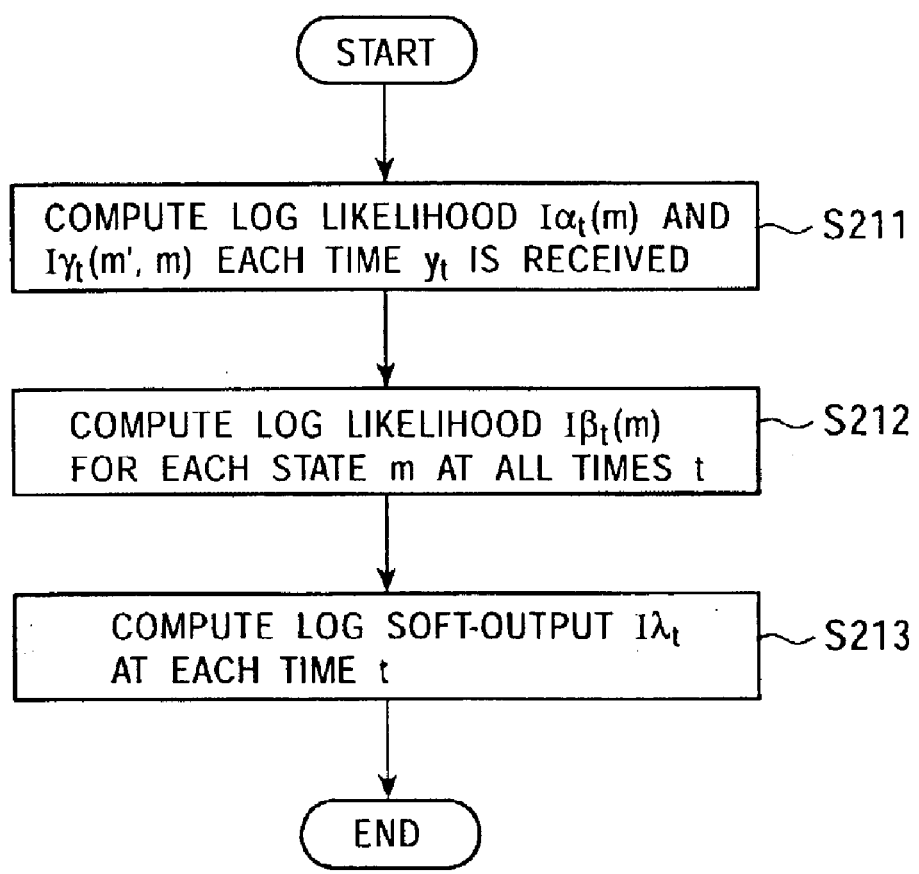
FIG. 23 is a flowchart illustrating a series of steps for performing soft-output decoding by application of the Max-Log-BCJR algorithm with a conventional decoding apparatus.
Figure 24:
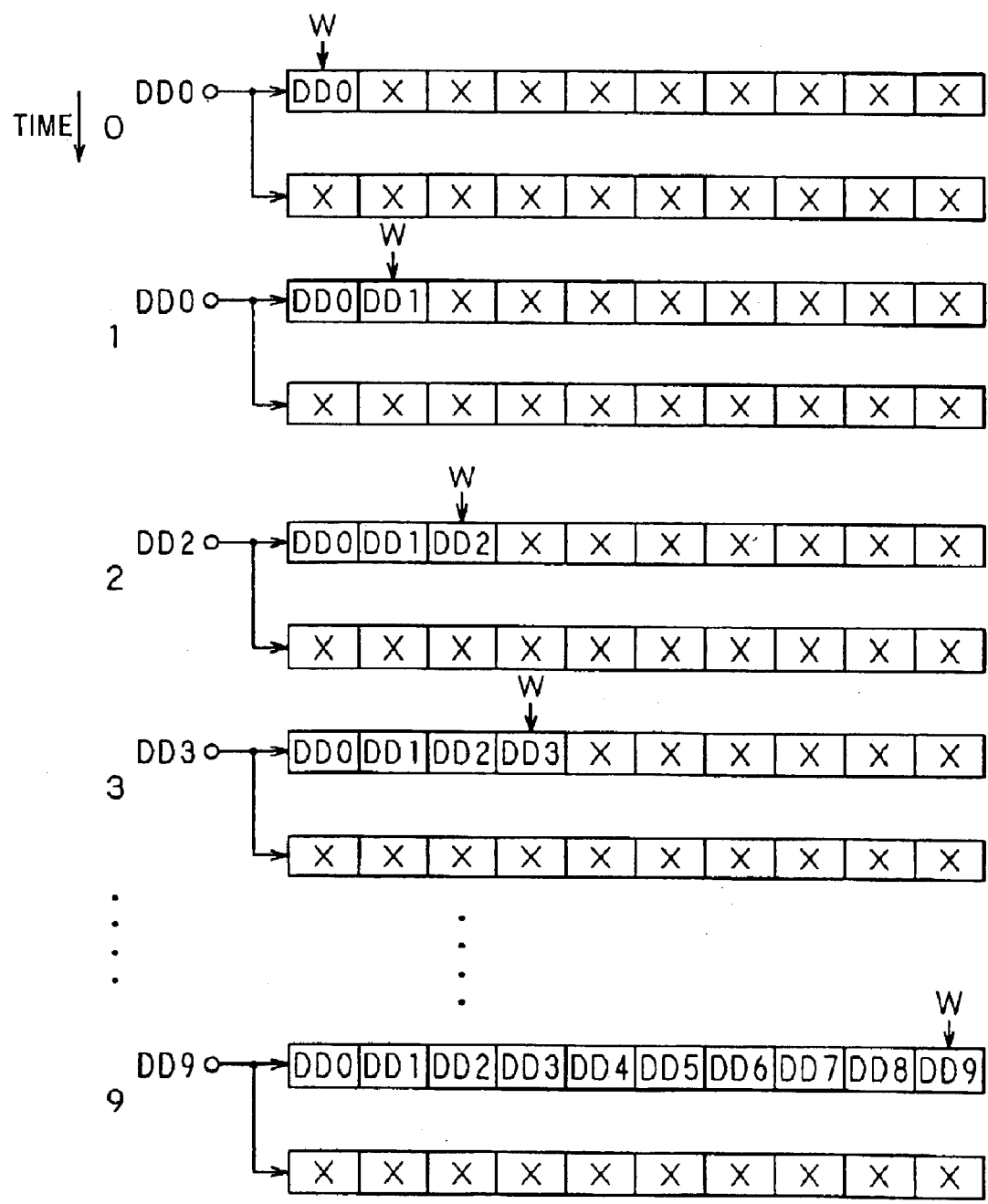
FIG. 24 is a diagram describing the actions of a conventional interleaver writing and reading data, and describes the manner wherein data of a first frame is written to one RAM bank.
Figure 25:
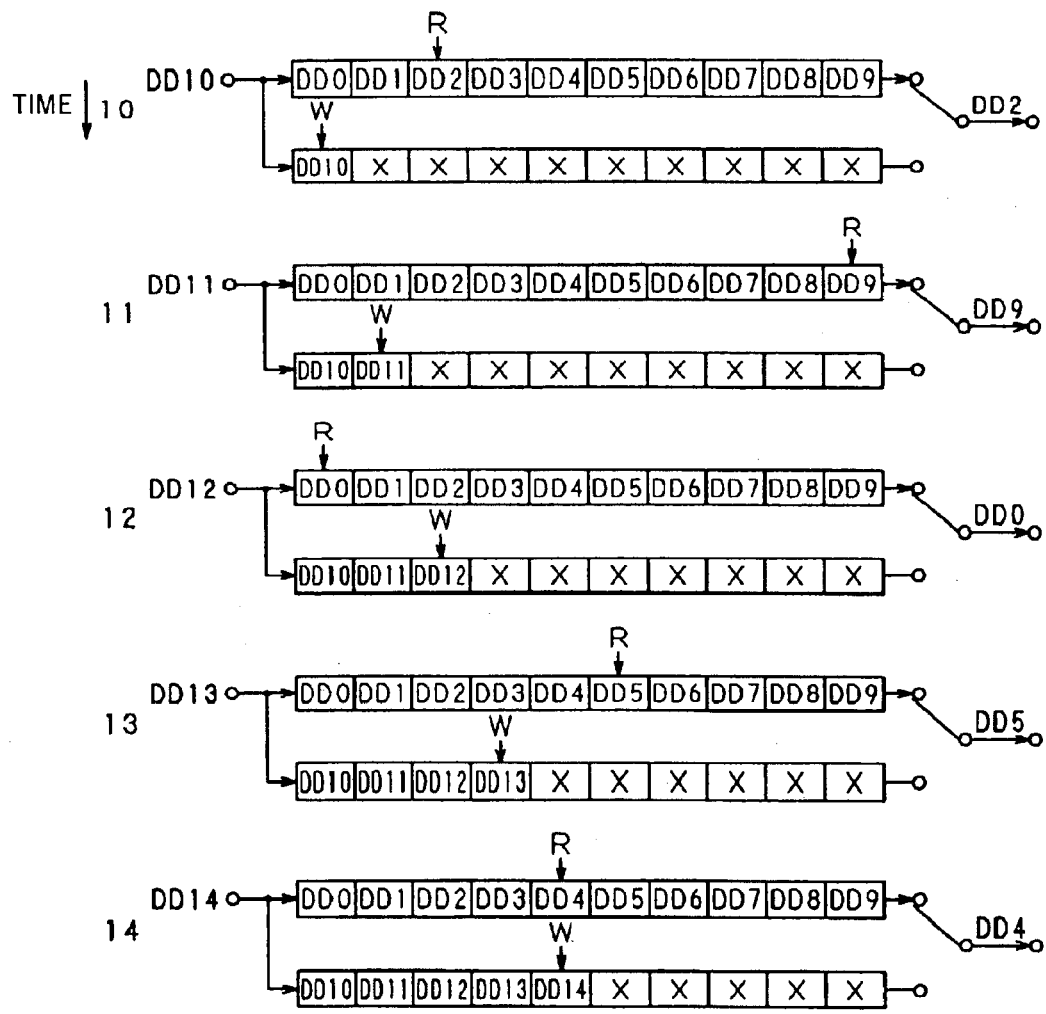
FIG. 25 is a diagram describing the actions of the interleaver writing and reading data following the state shown in FIG. 24, and describes the manner wherein partway through the data in the second frame is written to another RAM bank, while the data of the first frame which has been written to the one RAM bank is read out in a different order from which it was written.
Figure 26:
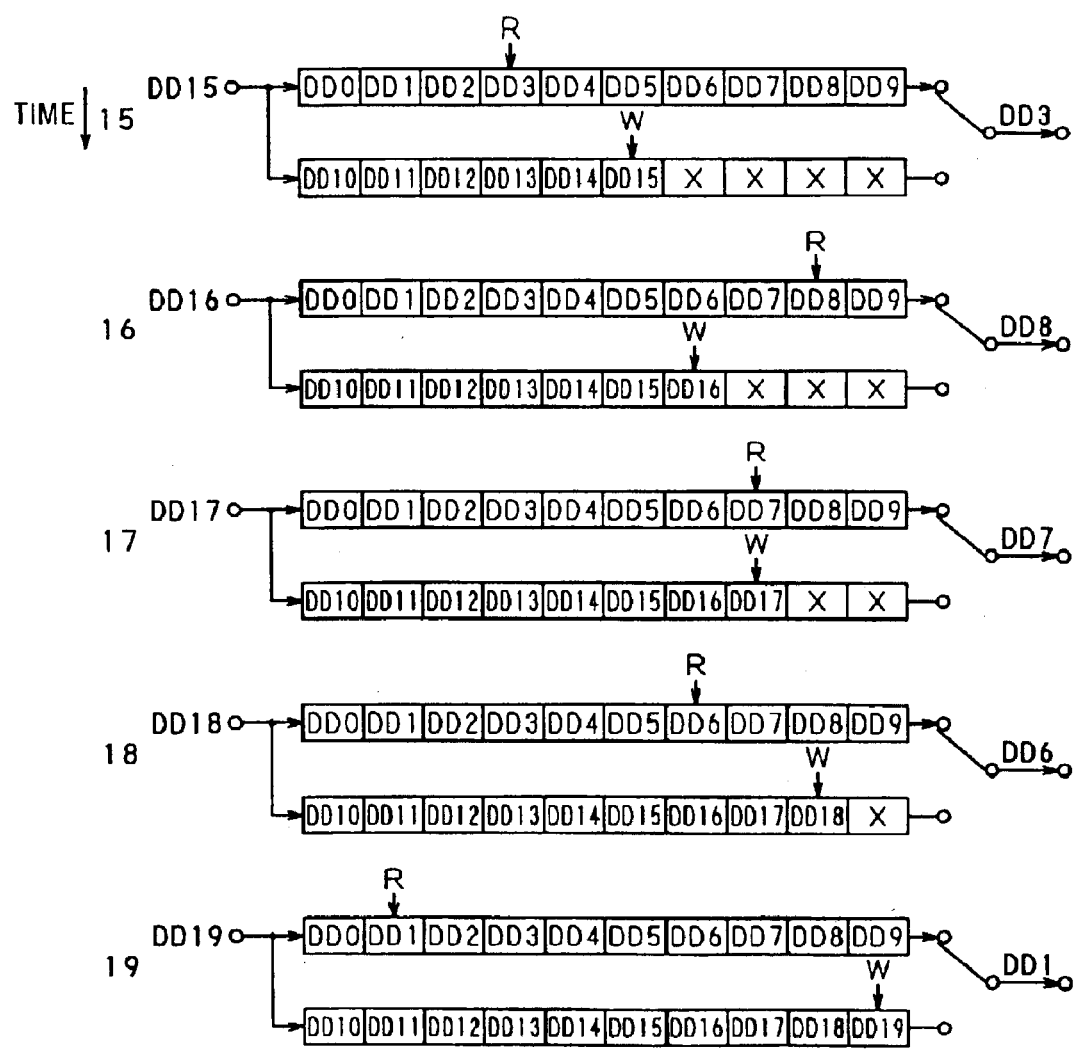
FIG. 26 is a diagram describing the actions of the interleaver writing and reading data following the state shown in FIG. 25, and describes the manner wherein, the remaining data of the second frame is written to the other RAM bank, while the data of the first frame which has been written to the one RAM bank is read out in a different order from which it was written.
Figure 27:
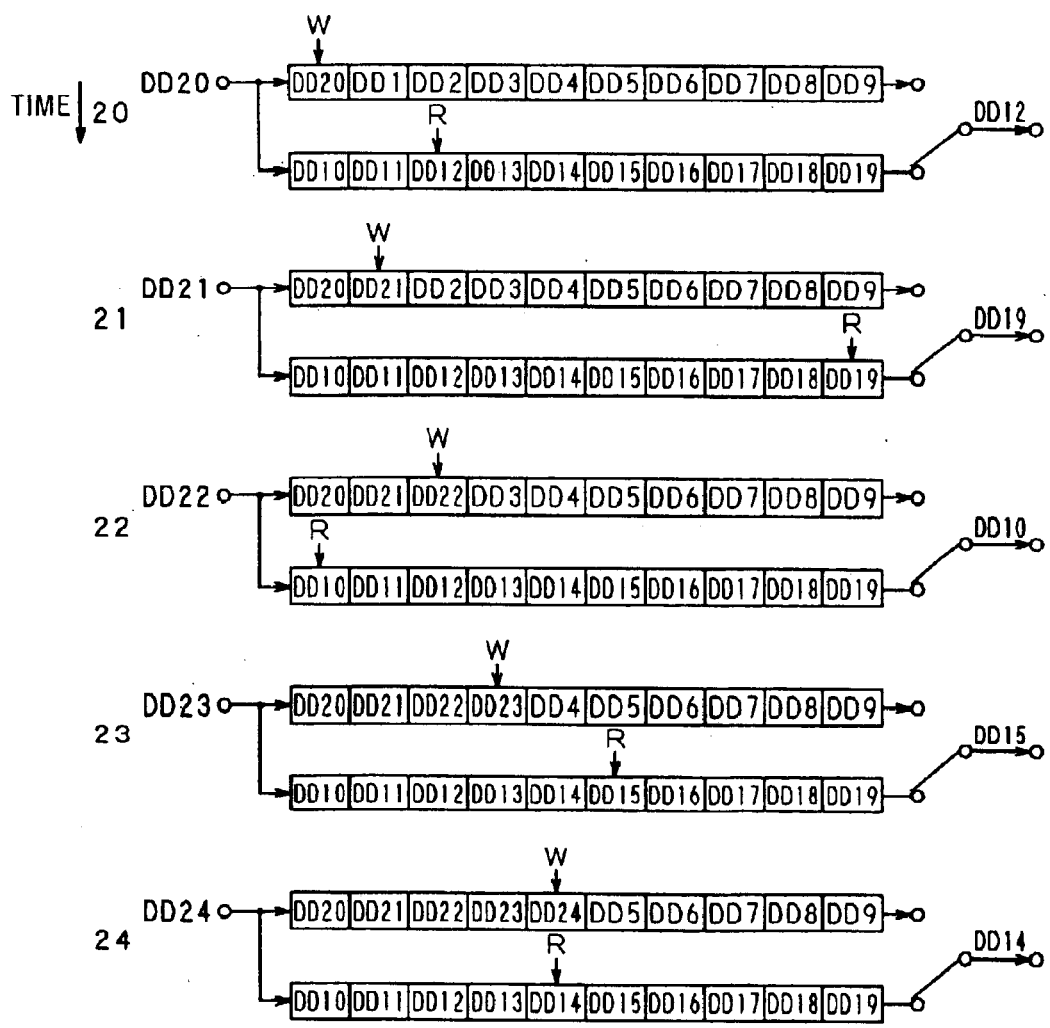
FIG. 27 is a diagram describing the actions of the interleaver writing and reading data following the state shown in FIG. 26, and describes the manner wherein partway through the data in the third frame is written to the one RAM bank, while the data of the second frame which has been written to the other RAM bank is read out in a different order from which it was written.
Figure 28:
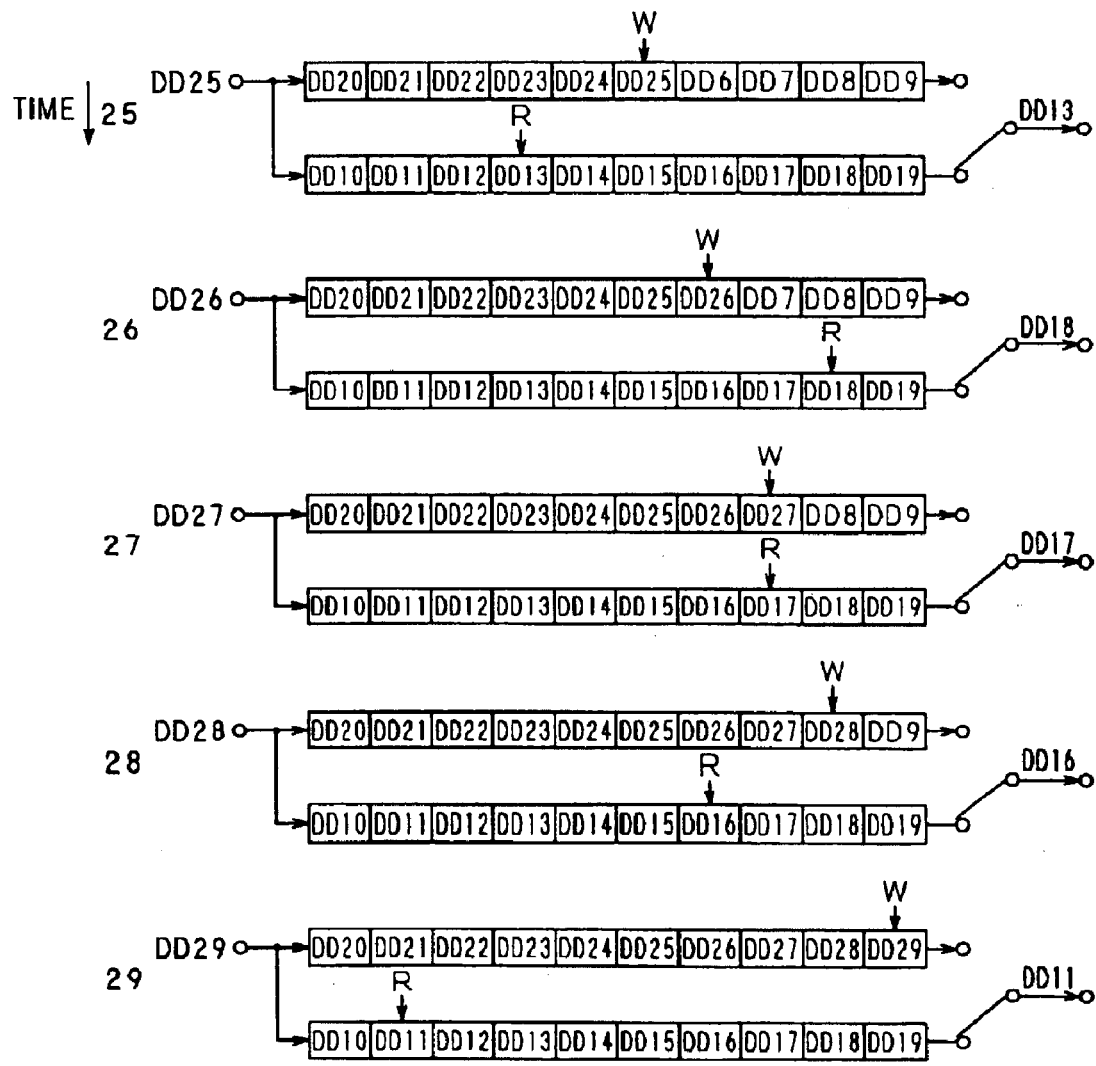
FIG. 28 is a diagram describing the actions of the interleaver writing and reading data following the state shown in FIG. 27, and describes the manner wherein, the remaining data of the third frame is written to the one RAM bank, while the data of the second frame which has been written to the other RAM bank is read out in a different order from which it was written.
Figure 29:
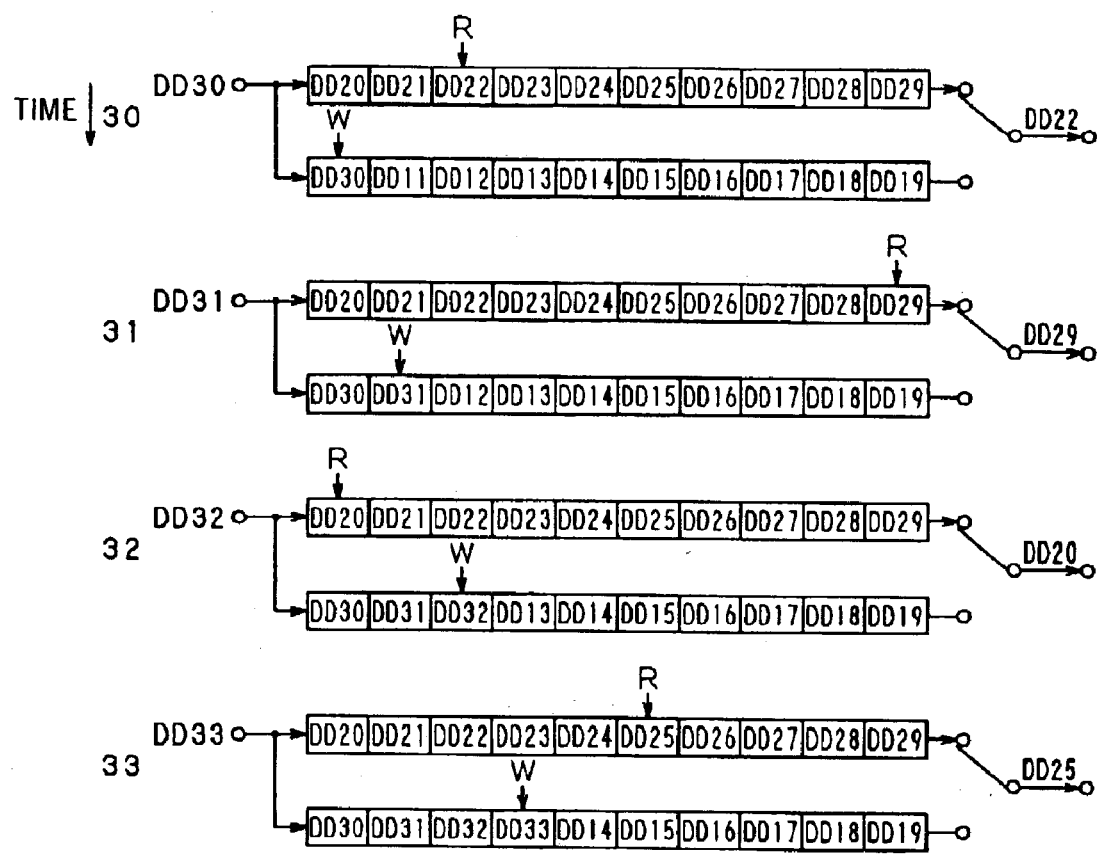
FIG. 29 is a diagram describing the actions of the interleaver writing and reading data following the state shown in FIG. 28, and describes the manner wherein partway through the data in the fourth frame is written to another RAM bank, while the data of the third frame which has been written to the one RAM bank is read out in a different order from which it was written.

That is, as shown in FIG. 19, in the 39th time slot, the interleaver 100 reads out the data DD32 from the storage area of the address 0 in the bank A RAM 1011, i.e., the storage area where the data DD32 was written in the 32nd time slot, and also writes the data DD39 to the storage area of the address 0 of the bank B RAM 1012, i.e., the storage area from which the data DD21 has been read out in the immediately preceding 38th time slot and now is empty. Next, in the 40th time slot, the interleaver 100 reads out the data DD39 from the storage area of the address 0 in the bank B RAM 1012, i.e., the storage area where the data DD39 was written in the 39th time slot, and also writes the data DD40 to the storage area of the address 0 of the bank A RAM 1011, i.e., the storage area from which the data DD32 has been read out in the immediately preceding 39th time slot and now is empty. Next, in the 41st time slot, the interleaver 100 reads out the data DD30 from the storage area of the address 1 in the bank A RAM 1011, i.e., the storage area where the data DD30 was written in the 30th time slot, and also writes the data DD41 to the storage area of the address 0 of the bank B RAM 1012, i.e., the storage area from which the data DD39 has been read out in the immediately preceding 40th time slot and now is empty. Next, in the 42nd time slot, the interleaver 100 reads out the data DD35 from the storage area of the address 1 in the bank B RAM 1012, i.e., the storage area where the data DD35 was written in the 35th time slot, and also writes the data DD42 to the storage area of the address 1 of the bank A RAM 1011, i.e., the storage area from which the data DD30 has been read out in the immediately preceding 41st time slot and now is empty. Next, in the 43rd time slot, the interleaver 100 reads out the data DD34 from the storage area of the address 2 in the bank A RAM 1011, i.e., the storage area where the data DD34 was written in the 32nd time slot, and also writes the data DD43 to the storage area of the address 1 of the bank B RAM 1012, i.e., the storage area from which the data DD35 has been read out in the immediately preceding 42nd time slot and now is empty.

Thus, the interleaver 100 reads out from the RAM 1011 and 1012 all of the 4th frame of data written in the order of DD30, DD31, DD32, DD33, DD34, DD35, DD36, DD37, DD38, and DD39, in an order differing from the writing order, i.e., DD32, DD39, DD30, DD35, DD34, . . . , while writing to the RAM 1011 and 1012 all of the data of the 5th frame except for the last data DD49, in the order of DD40, DD41, DD42, DD43, and so on.

In this way, the interleaver 100 uses the RAM 1011 and 1012 having half the capacity of the interleaving length, i.e., using storage devices which as a total have the same capacity as the interleaving length, to read out data from a predetermined address at one of the RAM 1011 and 1012 while writing data to a predetermined address at the other of the RAM 1011 and 1012 with regard to a certain frame, and with regard to the next frame, writes data to the address used for reading data from one of the RAM 1011 and 1012, while reading data from the predetermined address in the other of the RAM 1011 and 1012. The interleaver 100 alternately switches actions of writing data to a position from which data has been read out from immediately before between the RAM 1011 and 1012 each frame, thereby realizing consecutive interleaving with a small circuit size.

As described above, with the present data transmission/reception system, the encoding apparatus 1 and/or decoding apparatus 3 comprise an interleaver 100 wherein permuting from the input data into the output data is symmetrical, and wherein input data which is of an even number in order is output at an even number in order, and input data which is of an odd number in order is output at an odd number in order, and is capable of realizing consecutive interleaving using only the same capacity as the interleaving length, i.e., storage devices with half the capacity conventionally needed, by alternating each frame between sequential reading and reading following predetermined non-serial addresses.

Now, the longer the interleaving length is, the greater the effects of the interleaver 100 in reducing the size of the circuits are. Also, confirmation has been made that the effects of deterioration of performance based on regularity of addressees is practically unobserved as long as the interleaving length is set to around 10,000 bits or longer, for example.

Accordingly, the data transmission/reception system is capable of reducing the size of circuits while maintaining code performance, and thus can provide excellent usability.

Note that the present invention is by no means restricted to the above-described embodiment. For example, which the above embodiment has been described with reference to an example wherein RAM is used as the storage devices in the interleaver 100, the present invention is not restricted to using RAM for the storage devices here, rather, any article may be applied besides RAM as long as the same sort or writing and reading can be performed.

Also, while the above embodiment has been described with reference to an example wherein two bands of RAM 1011 and 1012 are used in the interleaver 100, the present invention may use more than two banks. In effect, an arrangement made to realize consecutive interleaving only by using storage devices having a total capacity equaling the interleaving length constitutes the present invention. In yet other words, the present invention is not restricted to a case wherein the relation between the above-described integers i, j, and k, is i=2 and j=k; rather, the present invention can be applied in any case wherein i≧3 and j!=k.

Further, while the above embodiment has been described with reference to an example wherein single-port RAM is used to configure the interleaver 100, the interleaver according to the present invention can be configured using dual-port RAM, as well. In this case, the interleaver 100 assumes a configuration using one RAM wherein the storage region of each address in the bank A RAM 1011 and the storage region of each address in the bank B RAM 1012 of the interleaver 100 are alternately connected, so it is needless to say that regularity of data input/output is based on the same address control as with the interleaver 100.

Moreover, while the above embodiment has been described with reference to an example wherein application is made to a data transmission/reception system comprising an encoding apparatus 1 for performing turbo encoding by concatenating multiple component encoders and interleavers which permute input data, and a decoding apparatus 3 which performs repeated decoding by concatenating multiple soft-output decoders with regard to the code encoded by the encoding apparatus 1 and interleavers which permute input data, the present invention need not adhere to data transmission/reception systems, and may be applied to any arrangement wherein interleaving and/or de-interleaving is performed.

Thus, it is clearly understood that various modifications may be made without departing from the spirit or scope of the present invention.

What is claimed is:

1. An interleaving apparatus which permutes the order of input data that is input following predetermined addresses, and outputs the permuted data as output data, said apparatus comprising:
   storage means for storing data; and
   control means for controlling writing and reading of data to and from said storage means such that said control means reads out data from said storage means in a manner alternating each frame between
      sequential reading, and
      non-sequential reading according to addresses; and
   said input data
      wherein permuting from said input data into said output data is symmetrical
      and which is at an arbitrary position wherein, with regard to an integer i which is 2 or greater and integers j and k which are 0 or greater but less than i, the residue from division by i is j
   is output as said output data at a position wherein the residue from division by i is k.

2. An interleaving apparatus according to claim 1, wherein said control means controls reading and writing of data to and from said storage means such that said input data which is of an even number in order is output at an even number in order, and said input data which is of an odd number in order is output at an odd number in order.

3. An interleaving apparatus according to claim 1, wherein said storage means comprises an i number of storage devices, each having a capacity of 1/i of an interleaving length;
   and wherein said control means
   reads out data from said storage means in a manner alternating each frame between
      sequential reading, and
      non-sequential reading according to addresses;
   writes data to said storage means such that subsequent data is written to a position from which data has been read at a preceding time; and
   causes the same storage device at the same time to perform one or the other of reading and writing.

4. An interleaving apparatus according to claim 3, wherein said storage means is single-port Random Access Memory.

5. An interleaving apparatus according to claim 1, wherein said storage means is configured using one storage device having the same capacity as the interleaving length;
   and wherein said control means
   reads out data from said storage means in a manner alternating each frame between
      sequential reading, and
      non-sequential reading according to addresses; and
   writes data to said storage means such that subsequent data is written to a position from which data has been read at a preceding time.

6. An interleaving apparatus according to claim 5, wherein said storage means is dual-port Random Access Memory.

7. An interleaving method which permutes the order of input data that is input following predetermined addresses, and outputs the permuted data as output data, said method comprising:
   an inputting step for inputting said input data;
   a control step for controlling writing and reading of data to and from storage means for storing data such that data is read out from said storage means in a manner alternating each frame between
      sequential reading, and
      non-sequential reading according to addresses; and
   said input data
      wherein permuting from said input data into said output data is symmetrical
      and which is at an arbitrary position wherein, with regard to an integer i which is 2 or greater and integers j and k which are 0 or greater but less than i, the residue from division by i is j
   is output as said output data at a position wherein the residue from division by i is k; and
   an outputting step for outputting said output data.

8. An interleaving method according to claim 7, wherein, in said control step, reading and writing of data to and from said storage means such that said input data which is of an even number in order is output at an even number in order, and said input data which is of an odd number in order is output at an odd number in order.

9. An interleaving method according to claim 7, wherein said storage means comprises an i number of storage devices, each having a capacity of 1/i of an interleaving length;
   and wherein, in said control step,
   data is read out from said storage means in a manner alternating each frame between
      sequential reading, and
      non-sequential reading according to addresses;
   data is written to said storage means such that subsequent data is written to a position from which data has been read at a preceding time; and the same storage device at the same time is caused to perform one or the other of reading and writing.

10. An interleaving method according to claim 9, wherein said storage means is single-port Random Access Memory.

11. An interleaving method according to claim 7, wherein said storage means is configured using one storage device having the same capacity as the interleaving length;

and wherein, in said control step, data is read out from said storage means in a manner alternating each frame between sequential reading, and non-sequential reading according to addresses; and data is written to said storage means such that subsequent data is written to a position from which data has been read at a preceding time.

12. An interleaving method according to claim 11, wherein said storage means is dual-port Random Access Memory.

13. An encoding apparatus for concatenating a plurality of component codes in parallel or serially via interleaving processing to perform encoding, said encoding apparatus comprising:

a plurality of component encoding means for performing predetermined encoding on input data; and interleaving means disposed between each of said plurality of component encoding means concatenated in parallel or serially, for permuting the order of input data following predetermined addresses, and outputting the permuted data as output data, said interleaving means comprising:

storage means for storing data; and control means for controlling writing and reading of data to and from said storage means such that said control means reads out data from said storage means in a manner alternating each frame between sequential reading, and non-sequential reading according to addresses; and said input data wherein permuting from said input data into said output data is symmetrical and which is at an arbitrary position wherein, with regard to an integer i which is 2 or greater and integers j and k which are 0 or greater but less than i, the residue from division by i is j is output as said output data at a position wherein the residue from division by i is k.

14. An encoding apparatus according to claim 13, wherein said control means controls reading and writing of data to and from said storage means such that said input data which is of an even number in order is output at an even number in order, and said input data which is of an odd number in order is output at an odd number in order.

15. An encoding apparatus according to claim 13, wherein said storage means comprises an i number of storage devices, each having a capacity of 1/i of an interleaving length;

and wherein said control means reads out data from said storage means in a manner alternating each frame between sequential reading, and non-sequential reading according to addresses;

writes data to said storage means such that subsequent data is written to a position from which data has been read at a preceding time; and causes the same storage device at the same time to perform one or the other of reading and writing.

16. An encoding apparatus according to claim 15, wherein said storage means is single-port Random Access Memory.

17. An encoding apparatus according to claim 13, wherein said storage means is configured using one storage device having the same capacity as the interleaving length;

and wherein said control means reads out data from said storage means in a manner alternating each frame between sequential reading, and non-sequential reading according to addresses; and writes data to said storage means such that subsequent data is written to a position from which data has been read at a preceding time.

18. An encoding apparatus according to claim 17, wherein said storage means is dual-port Random Access Memory.

19. An encoding apparatus according to claim 13, which performs parallel concatenated encoding, serial concatenated encoding, parallel concatenated encoding modulation, or serial concatenated encoding modulation.

20. An encoding apparatus according to claim 19, wherein said component encoding means performs convolutional encoding.

21. An encoding method for concatenating a plurality of component codes in parallel or serially via interleaving processing to perform encoding, said encoding method comprising:

a plurality of component encoding steps for performing predetermined encoding on input data; and an interleaving step which is executed between each of said plurality of component encoding steps concatenated in parallel or serially, for permuting the order of input data that is input following predetermined addresses, and outputting the permuted data as output data, said interleaving step comprising:

an inputting step for inputting said input data;

a control step for controlling writing and reading of data to and from said storage means for storing data such that data is read out from said storage means in a manner alternating each frame between sequential reading, and non-sequential reading according to addresses; and said input data wherein permuting from said input data into said output data is symmetrical and which is at an arbitrary position wherein, with regard to an integer i which is 2 or greater and integers j and k which are 0 or greater but less than i, the residue from division by i is j is output as said output data at a position wherein the residue from division by i is k; and an outputting step for outputting said output data.

22. An encoding method according to claim 21, wherein, in said control step, reading and writing of data to and from said storage means is controlled such that said input data which is of an even number in order is output at an even number in order, and said input data which is of an odd number in order is output at an odd number in order.

23. An encoding method according to claim 21, wherein said storage means comprises an i number of storage devices, each having a capacity of 1/i of an interleaving length;

and wherein, in said control step, data is read out from said storage means in a manner alternating each frame between sequential reading, and non-sequential reading according to addresses;

data is written to said storage means such that subsequent data is written to a position from which data has been read at a preceding time; and the same storage device at the same time is caused to perform one or the other of reading and writing.

24. An encoding method according to claim 23, wherein said storage means is single-port Random Access Memory.

25. An encoding method according to claim 21, wherein said storage means is configured using one storage device having the same capacity as the interleaving length;

and wherein, in said control step, data is read out from said storage means in a manner alternating each frame between
sequential reading, and
non-sequential reading according to addresses; and data is written to said storage means such that subsequent data is written to a position from which data has been read at a preceding time.

26. An encoding method according to claim 25, wherein said storage means is dual-port Random Access Memory.

27. An encoding method according to claim 21, wherein parallel concatenated encoding, serial concatenated encoding, parallel concatenated encoding modulation, or serial concatenated encoding modulation, is performed.

28. An encoding method according to claim 27, wherein, in said component encoding step, convolutional encoding is performed.

29. A decoding apparatus for decoding code generated by concatenating a plurality of component codes in parallel or serially via interleaving processing, said decoding apparatus comprising:

a plurality of soft-output decoding means provided corresponding to said plurality of component codes, for performing soft-output decoding by inputting received values to be taken as soft-input and a priori probability information, thereby generating soft-output and/or extrinsic information at each time; and interleaving means wherein said extrinsic information generated by said soft-output decoding means is input, for performing interleaving processing for permuting the order of said extrinsic information according to predetermined addresses, based on the same permuting position information as said interleaving processing in encoding, or de-interleaving processing for permuting the order of said extrinsic information according to predetermined addresses, so as to restore the array of information permuted by said interleaving processing in encoding, said interleaving means comprising:

storage means for storing data; and control means for controlling writing and reading of data to and from said storage means such that said control means reads out data from said storage means in a manner alternating each frame between
sequential reading, and
non-sequential reading according to addresses; and
said input data
wherein permuting from input data that is input into output data that is output is symmetrical
and which is at an arbitrary position wherein, with regard to an integer i which is 2 or greater and integers j and k which are 0 or greater but less than i, the residue from division by i is j
is output as said output data at a position wherein the residue from division by i is k.

30. A decoding apparatus according to claim 29, wherein said control means controls reading and writing of data to and from said storage means such that said input data which is of an even number in order is output at an even number in order, and said input data which is of an odd number in order is output at an odd number in order.

31. A decoding apparatus according to claim 29, wherein said storage means comprises an i number of storage devices, each having a capacity of 1/i of an interleaving length;

and wherein said control means reads out data from said storage means in a manner alternating each frame between
sequential reading, and
non-sequential reading according to addresses;

writes data to said storage means such that subsequent data is written to a position from which data has been read at a preceding time; and causes the same storage device at the same time to perform one or the other of reading and writing.

32. A decoding apparatus according to claim 31, wherein said storage means is single-port Random Access Memory.

33. A decoding apparatus according to claim 29, wherein said storage means is configured using one storage device having the same capacity as the interleaving length;

and wherein said control means reads out data from said storage means in a manner alternating each frame between
sequential reading, and
non-sequential reading according to addresses; and writes data to said storage means such that subsequent data is written to a position from which data has been read at a preceding time.

34. A decoding apparatus according to claim 33, wherein said storage means is dual-port Random Access Memory.

35. A decoding apparatus according to claim 29, which obtains the probability of passing through an arbitrary state based on said received values, and performing repeated decoding of said code using said probability.

36. A decoding apparatus according to claim 35, wherein code subjected to parallel concatenated decoding, serial concatenated decoding, parallel concatenated decoding modulation, or serial concatenated decoding modulation, is repeatedly decoded.

37. A decoding apparatus according to claim 36, wherein said component code is convolutional code.

38. A decoding apparatus according to claim 35, wherein said soft-output decoding means perform maximum a posteriori probability decoding, based on the BCJR algorithm, Max-Log-BCJR algorithm, or Log-BCJR algorithm.

39. A decoding method for decoding code generated by concatenating a plurality of component codes in parallel or serially via interleaving processing, said decoding method comprising:

a plurality of soft-output decoding steps provided corresponding to said plurality of component codes, for performing soft-output decoding by inputting received values to be taken as soft-input and a priori probability information, thereby generating soft-output and/or extrinsic information at each time; and an interleaving step wherein said extrinsic information generated in said soft-output decoding steps is input, for performing interleaving processing for permuting the order of said extrinsic information according to predetermined addresses, based on the same permuting position information as said interleaving processing in encoding, or de-interleaving processing for permuting the order of said extrinsic information according to predetermined addresses, so as to restore the array of information permuted by said interleaving processing in encoding, said interleaving step comprising:

an inputting step for inputting data;

a control step for controlling writing and reading of data to and from said storage means such that data is read out from said storage means in a manner alternating each frame between sequential reading, and non-sequential reading according to addresses; and said input data wherein permuting from input data that is input in said inputting step into output data that is output is symmetrical and which is at an arbitrary position wherein, with regard to an integer i which is 2 or greater and integers j and k which are 0 or greater but less than i, the residue from division by i is j is output as said output data at a position wherein the residue from division by i is k; and an outputting step for outputting said output data.

40. A decoding method according to claim 39, wherein, in said control step, reading and writing of data to and from said storage means is controlled such that said input data which is of an even number in order is output at an even number in order, and said input data which is of an odd number in order is output at an odd number in order.

41. A decoding method according to claim 39, wherein said storage means comprises an i number of storage devices, each having a capacity of 1/i of an interleaving length;

and wherein, in said control step, data is reads out from said storage means in a manner alternating each frame between sequential reading, and non-sequential reading according to addresses;

data is written to said storage means such that subsequent data is written to a position from which data has been read at a preceding time; and the same storage device at the same time is caused to perform one or the other of reading and writing.

42. A decoding method according to claim 41, wherein said storage means is single-port Random Access Memory.

43. A decoding method according to claim 39, wherein said storage means is configured using one storage device having the same capacity as the interleaving length;

and wherein, in said control step, data is read out from said storage means in a manner alternating each frame between sequential reading, and non-sequential reading according to addresses; and data is written to said storage means such that subsequent data is written to a position from which data has been read at a preceding time.

44. A decoding method according to claim 43, wherein said storage means is dual-port Random Access Memory.

45. A decoding method according to claim 39, wherein the probability of passing through an arbitrary state is obtained based on said received values, and repeated decoding of said code is performed using said probability.

46. A decoding method according to claim 45, wherein code subjected to parallel concatenated decoding, serial concatenated decoding, parallel concatenated decoding modulation, or serial concatenated decoding modulation, is repeatedly decoded.

47. A decoding method according to claim 46, wherein said component code is convolutional code.

48. A decoding method according to claim 45, wherein, in said soft-output steps, maximum a posteriori probability decoding is performed, based on the BCJR algorithm, Max-Log-BCJR algorithm, or Log-BCJR algorithm.

* * * * *